(12) United States Patent
Goda et al.

(10) Patent No.: US 12,068,272 B2
(45) Date of Patent: Aug. 20, 2024

(54) MICROELECTRONIC DEVICES HAVING A MEMORY ARRAY REGION, A CONTROL LOGIC REGION, AND SIGNAL ROUTING STRUCTURES

(71) Applicant: Micron Technology, Inc., Boise, ID (US)

(72) Inventors: Akira Goda, Tokyo (JP); Kunal R. Parekh, Boise, ID (US); Aaron S. Yip, Los Gatos, CA (US)

(*) Notice: Subject to any disclaimer, the term of this patent is extended or adjusted under 35 U.S.C. 154(b) by 0 days.

(21) Appl. No.: 18/059,165

(22) Filed: Nov. 28, 2022

(65) Prior Publication Data
US 2023/0092320 A1    Mar. 23, 2023

Related U.S. Application Data

(63) Continuation of application No. 16/992,566, filed on Aug. 13, 2020, now Pat. No. 11,545,456.

(51) Int. Cl.
*H01L 25/18* (2023.01)
*H01L 23/00* (2006.01)
(Continued)

(52) U.S. Cl.
CPC ............. *H01L 24/20* (2013.01); *H01L 24/03* (2013.01); *H01L 24/05* (2013.01); *H01L 24/19* (2013.01);
(Continued)

(58) Field of Classification Search
CPC ........ H10B 43/10; H10B 43/27; H10B 43/40; H10B 43/50; H10B 41/10; H10B 41/27;
(Continued)

(56) References Cited

U.S. PATENT DOCUMENTS 10,665,580 B1    5/2020  Hosoda et al.
10,748,894 B2 *  8/2020  Chowdhury ............ H01L 25/18
(Continued)

FOREIGN PATENT DOCUMENTS

TW    201842601 A    12/2018
WO    2019/104896 A1    6/2019

OTHER PUBLICATIONS

International Search Report for Application No. PCT/US2021/041603, mailed Nov. 4, 2021, 4 pages.
(Continued)

*Primary Examiner* — Khiem D Nguyen
(74) *Attorney, Agent, or Firm* — TraskBritt

(57) ABSTRACT

A microelectronic device comprises a first die and a second die attached to the first die. The first die comprises a memory array region comprising a stack structure comprising vertically alternating conductive structures and insulative structures, vertically extending strings of memory cells within the stack structure, and first bond pad structures vertically neighboring the vertically extending strings of memory cells. The second die comprises a control logic region comprising control logic devices configured to effectuate at least a portion of control operations for the vertically extending string of memory cells, second bond pad structures in electrical communication with the first bond pad structures, and signal routing structures located at an interface between the first die and the second die. Related microelectronic devices, electronic systems, and methods are also described.

16 Claims, 10 Drawing Sheets

(51) Int. Cl.
*H10B 41/10* (2023.01)
*H10B 41/27* (2023.01)
*H10B 41/40* (2023.01)
*H10B 43/10* (2023.01)
*H10B 43/27* (2023.01)
*H10B 43/40* (2023.01)

(52) U.S. Cl.
CPC ............ *H01L 25/18* (2013.01); *H10B 41/10* (2023.02); *H10B 41/27* (2023.02); *H10B 41/40* (2023.02); *H10B 43/10* (2023.02); *H10B 43/27* (2023.02); *H10B 43/40* (2023.02); *H01L 2924/1431* (2013.01); *H01L 2924/1438* (2013.01)

(58) Field of Classification Search
CPC ......... H10B 41/40; H01L 24/09; H01L 24/19; H01L 24/20; H01L 2224/0603; H01L 2224/06051; H01L 2224/08058; H01L 2224/08121; H01L 2224/09517; H01L 2224/80894; H01L 2224/80895; H01L 2224/80896; H01L 2224/08145; H01L 24/03; H01L 24/05; H01L 24/06; H01L 2924/1431; H01L 2924/1438; H01L 2224/80357
See application file for complete search history.

(56) References Cited

U.S. PATENT DOCUMENTS

| | | | |
|---|---|---|---|
| 10,797,035 B1 * | 10/2020 | Sano | H01L 24/09 |
| 10,985,169 B2 * | 4/2021 | Kai | H10B 43/27 |
| 11,211,372 B2 * | 12/2021 | Park | H10B 43/50 |
| 11,335,602 B2 | 5/2022 | Parekh | |
| 11,380,669 B2 | 7/2022 | Parekh | |
| 11,545,456 B2 * | 1/2023 | Goda | H10B 41/10 |
| 11,557,569 B2 | 1/2023 | Parekh | |
| 11,563,018 B2 | 1/2023 | Parekh | |
| 2011/0156281 A1 * | 6/2011 | Pan | H01L 23/3121 257/784 |
| 2016/0233264 A1 | 8/2016 | Kagawa et al. | |
| 2019/0013326 A1 | 1/2019 | Hua et al. | |
| 2019/0043836 A1 | 2/2019 | Fastow et al. | |
| 2019/0043868 A1 | 2/2019 | Hasnat et al. | |
| 2019/0057756 A1 | 2/2019 | Kim et al. | |
| 2019/0164983 A1 * | 5/2019 | Hu | H10B 41/35 |
| 2019/0221557 A1 * | 7/2019 | Kim | H01L 24/80 |
| 2019/0295668 A1 | 9/2019 | Goda et al. | |
| 2019/0326198 A1 | 10/2019 | Vaidya et al. | |
| 2019/0363079 A1 * | 11/2019 | Thei | H01L 23/481 |
| 2020/0066703 A1 | 2/2020 | Kim et al. | |
| 2020/0105774 A1 | 4/2020 | Penumatcha et al. | |
| 2020/0111530 A1 | 4/2020 | Goda et al. | |
| 2020/0144242 A1 | 5/2020 | Park | |
| 2020/0227397 A1 | 7/2020 | Yada et al. | |
| 2020/0258816 A1 * | 8/2020 | Okina | H10B 43/40 |
| 2020/0286842 A1 * | 9/2020 | Sanuki | G11C 5/063 |
| 2020/0294918 A1 * | 9/2020 | Nishida | H01L 21/76898 |
| 2020/0350322 A1 * | 11/2020 | Liu | H10B 12/50 |
| 2021/0217730 A1 | 7/2021 | Parekh et al. | |
| 2021/0375806 A1 | 12/2021 | Zhang | |
| 2021/0398847 A1 | 12/2021 | Parekh | |
| 2021/0398897 A1 | 12/2021 | Parekh | |
| 2022/0020736 A1 | 1/2022 | Yip et al. | |

OTHER PUBLICATIONS

Taiwanese Search Report and Office Action from Taiwanese Application No. 110127092, dated Apr. 18, 2022, 19 pages with English translation.

Written Opinion of the International Searching Authority for Application No. PCT/US2021/041603, mailed Nov. 4, 2021, 5 pages.

* cited by examiner

MICROELECTRONIC DEVICES HAVING A MEMORY ARRAY REGION, A CONTROL LOGIC REGION, AND SIGNAL ROUTING STRUCTURES

CROSS-REFERENCE TO RELATED APPLICATION

This application is a continuation of U.S. patent application Ser. No. 16/992,566, filed Aug. 13, 2020, issued as U.S. Pat. No. 11,545,456, issued Jan. 3, 2023, the disclosure of which is hereby incorporated herein in its entirety by this reference.

TECHNICAL FIELD

The disclosure, in various embodiments, relates generally to the field of microelectronic device design and fabrication. More specifically, the disclosure relates to methods of forming microelectronic devices, and to related microelectronic devices and electronic systems.

BACKGROUND

Microelectronic device designers often desire to increase the level of integration or density of features within a microelectronic device by reducing the dimensions of the individual features and by reducing the separation distance between neighboring features. In addition, microelectronic device designers often desire to design architectures that are not only compact, but offer performance advantages, as well as simplified designs.

One example of a microelectronic device is a memory device. Memory devices are generally provided as internal integrated circuits in computers or other electronic devices. There are many types of memory devices including, but not limited to, non-volatile memory devices (e.g., NAND Flash memory devices). One way of increasing memory density in non-volatile memory devices is to utilize vertical memory array (also referred to as a "three-dimensional (3D) memory array") architectures. A conventional vertical memory array includes vertical memory strings extending through openings in one or more decks (e.g., stack structures) including tiers of conductive structures and dielectric materials. Each vertical memory string may include at least one select device coupled in series to a serial combination of vertically stacked memory cells. Such a configuration permits a greater number of switching devices (e.g., transistors) to be located in a unit of die area (i.e., length and width of active surface consumed) by building the array upwards (e.g., vertically) on a die, as compared to structures with conventional planar (e.g., two-dimensional) arrangements of transistors.

Control logic devices within a base control logic structure underlying a memory array of a memory device (e.g., a non-volatile memory device) have been used to control operations (e.g., access operations, read operations, write operations) of the memory cells of the memory device. An assembly of the control logic devices may be provided in electrical communication with the memory cells of the memory array by way of routing and interconnect structures. However, as the density of the memory cells of the memory devices increases, the density of the routing and interconnect structures exhibits a corresponding increase in density and complexity.

DETAILED DESCRIPTION

Figure 1A:
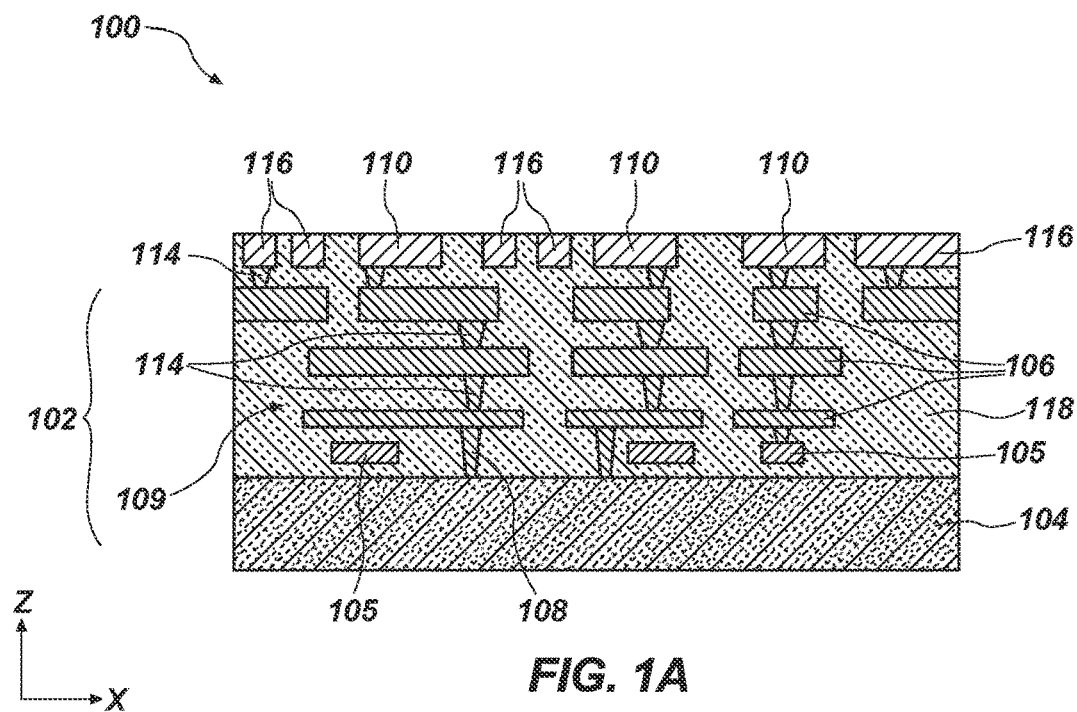
FIG. 1A is a simplified partial cross-sectional view of a first microelectronic device structure, in accordance with embodiments of the disclosure.

The illustrations included herewith are not meant to be actual views of any particular systems, microelectronic structures, microelectronic devices, or integrated circuits thereof, but are merely idealized representations that are employed to describe embodiments herein. Elements and features common between figures may retain the same numerical designation except that, for ease of following the description, reference numerals begin with the number of the drawing on which the elements are introduced or most fully described.

The following description provides specific details, such as material types, material thicknesses, and processing conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete process flow for manufacturing a microelectronic device (e.g., a memory device, such as a 3D NAND Flash memory device) or a complete microelectronic device. The structures described below do not form a complete microelectronic device. Only those process acts and structures necessary to understand the embodiments described herein are described in detail below.

Additional acts to form a complete microelectronic device from the structures may be performed by conventional techniques.

The materials described herein may be formed by conventional techniques including, but not limited to, spin coating, blanket coating, chemical vapor deposition (CVD), atomic layer deposition (ALD), plasma enhanced ALD, physical vapor deposition (PVD), plasma enhanced chemical vapor deposition (PECVD), or low pressure chemical vapor deposition (LPCVD). Alternatively, the materials may be grown in situ. Depending on the specific material to be formed, the technique for depositing or growing the material may be selected by a person of ordinary skill in the art. The removal of materials may be accomplished by any suitable technique including, but not limited to, etching, abrasive planarization (e.g., chemical-mechanical planarization), or other known methods unless the context indicates otherwise.

As used herein, the term "configured" refers to a size, shape, material composition, orientation, and arrangement of one or more of at least one structure and at least one apparatus facilitating operation of one or more of the structure and the apparatus in a predetermined way.

As used herein, the terms "longitudinal," "vertical," "lateral," and "horizontal" are in reference to a major plane of a substrate (e.g., base material, base structure, base construction, etc.) in or on which one or more structures and/or features are formed and are not necessarily defined by Earth's gravitational field. A "lateral" or "horizontal" direction is a direction that is substantially parallel to the major plane of the substrate, while a "longitudinal" or "vertical" direction is a direction that is substantially perpendicular to the major plane of the substrate. The major plane of the substrate is defined by a surface of the substrate having a relatively large area compared to other surfaces of the substrate.

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped, etc.) and the spatially relative descriptors used herein interpreted accordingly.

As used herein, features (e.g., regions, materials, structures, devices) described as "neighboring" one another means and includes features of the disclosed identity (or identities) that are located most proximate (e.g., closest to) one another. Additional features (e.g., additional regions, additional materials, additional structures, additional devices) not matching the disclosed identity (or identities) of the "neighboring" features may be disposed between the "neighboring" features. Put another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, the term "memory device" means and includes microelectronic devices exhibiting memory functionality, but not necessarily limited to memory functionality. Stated another way, and by way of example only, the term "memory device" means and includes not only conventional memory (e.g., conventional volatile memory, such as conventional dynamic random access memory (DRAM); conventional non-volatile memory, such as conventional NAND memory), but also includes an application specific integrated circuit (ASIC) (e.g., a system on a chip (SoC)), a microelectronic device combining logic and memory, and a graphics processing unit (GPU) incorporating memory.

As used herein, "conductive material" means and includes electrically conductive material such as one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and a conductively-doped semiconductor material (e.g., conductively-doped polysilicon, conductively-doped germanium (Ge), conductively-doped silicon germanium (SiGe)). In addition, a "conductive structure" means and includes a structure formed of and including a conductive material.

As used herein, "insulative material" means and includes electrically insulative material, such one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$), at least one dielectric nitride material (e.g., a silicon nitride ($SiN_y$)), at least one dielectric oxynitride material (e.g., a silicon oxynitride ($SiO_xN_y$)), and at least one dielectric carboxynitride material (e.g., a silicon carboxynitride ($SiO_xC_zN_y$)). Formulae including one or more of "x," "y," and "z" herein (e.g., $SiO_x$, $AlO_x$, $HfO_x$, $NbO_x$, $TiO_x$, $SiN_y$, $SiO_xN_y$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including an insulative material.

According to embodiments described herein, a microelectronic device includes a first microelectronic device structure and at least a second microelectronic device structure coupled to the first microelectronic device structure. The first microelectronic device structure may include, for example, a control logic wafer comprising various control logic devices (e.g., complementary metal-oxide-semiconductor (CMOS) devices) and structures, and the second microelectronic device structure may comprise, for example, an array wafer comprising a memory array region and associated circuitry. The first microelectronic device structure and the second microelectronic device structure may be formed separately, facilitating fabrication of transistors of devices (e.g., control logic devices) and circuits thereof at different processing conditions (e.g., temperature) suitable for the available thermal budget for the respective one of the first microelectronic device structure and the second microelectronic device structure. The first microelectronic device structure may include first bond pad structures on a surface thereof configured to couple to second bond pad structures on a surface of the second microelectronic device structure to attach the first microelectronic device structure to the second microelectronic device structure and form a microelectronic device structure assembly. In some embodiments, the first microelectronic device structure includes signal routing structures laterally neighboring the first bond pad structures. At least a portion of the signal routing structures may be vertically aligned (e.g., co-planar) with at least a portion of the first bond pad structures. Stated another way, the signal routing structures may be located at an interface between the first microelectronic device structure and the second microelectronic device structure and may not be vertically displaced from the first bond pad structures. In some embodiments, a pitch of the signal routing structures is less than a pitch of the first bond pad structures. In some embodiments, the second microelectronic device structure includes additional signal routing structures configured to be located at the interface between the first microelectronic device structure and the second microelectronic device structure.

Including the signal routing structures at the interface between the first microelectronic device structure and the second microelectronic device structure may facilitate an increased density of features of the first microelectronic device structure and the second microelectronic device structure. In some embodiments, the signal routing structures may utilize area of the first microelectronic device structure that would otherwise be unused (e.g., comprise silicon dioxide, dummy bond pad structures).

FIG. 1A through FIG. 1F are simplified partial cross-sectional views (FIG. 1A, FIG. 1C, FIG. 1E) and simplified partial top down views (FIG. 1B, FIG. 1D, FIG. 1F) illustrating embodiments of a method of forming a microelectronic device (e.g., a memory device, such as a 3D NAND Flash memory device). With the description provided below, it will be readily apparent to one of ordinary skill in the art that the methods and structures described herein with reference to FIG. 1A through FIG. 1F may be used in various devices and electronic systems.

Figure 1B:
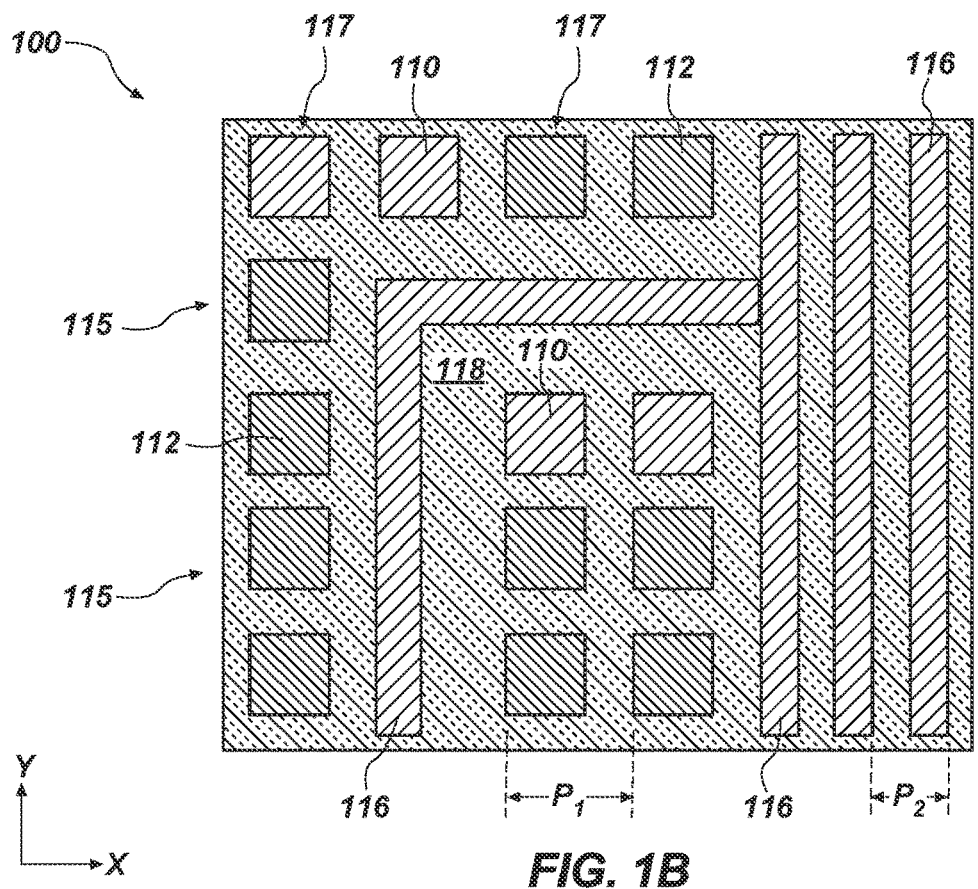
FIG. 1B is a simplified partial top down view of the first microelectronic device structure of FIG. 1A.

FIG. 1A is a simplified partial cross-sectional view of a first microelectronic device structure 100, and FIG. 1B is a simplified partial top view of the first microelectronic device structure 100. Referring to FIG. 1A, the first microelectronic device structure 100 (e.g., a chiplet, a first die) may be formed to include a control logic region 102. The control logic region 102 includes a semiconductive base structure 104, gate structures 105, first signal routing structures 106, and first interconnect structures 108. Portions of the semiconductive base structure 104, the gate structures 105, the first signal routing structures 106, and the first interconnect structures 108 form various control logic devices 109 of the control logic region 102, as described in further detail below.

The semiconductive base structure 104 (e.g., semiconductive wafer) of the control logic region 102 comprises a base material or construction upon which additional materials and structures of the first microelectronic device structure 100 are formed. The semiconductive base structure 104 may comprise a semiconductive structure (e.g., a semiconductive wafer), or a base semiconductive material on a supporting structure. For example, the semiconductive base structure 104 may comprise a conventional silicon substrate (e.g., a conventional silicon wafer), or another bulk substrate comprising a semiconductive material. As used herein, the term "bulk substrate" means and includes not only silicon substrates, but also silicon-on-insulator (SOI) substrates, such as silicon-on-sapphire (SOS) substrates and silicon-on-glass (SOG) substrates, epitaxial layers of silicon on a base semiconductive foundation, and other substrates formed of and including one or more semiconductive materials (e.g., one or more of a silicon material, such as monocrystalline silicon or polycrystalline silicon; silicon-germanium; germanium; gallium arsenide; a gallium nitride; and indium phosphide). In some embodiments, the semiconductive base structure 104 comprises a silicon wafer. In addition, the semiconductive base structure 104 may include different layers, structures, and/or regions formed therein and/or thereon. For example, the semiconductive base structure 104 may include conductively doped regions and undoped regions. At least some of the conductively doped regions may, for example, be employed as source regions and drain regions for transistors of the control logic devices 109 of the first control logic region 102; and at least some of the undoped regions may, for example, be employed as channel regions for the transistors of the control logic devices 109.

As shown in FIG. 1A, the gate structures 105 of the control logic region 102 of the first microelectronic device structure 100 may vertically overlie portions of the semiconductive base structure 104. The gate structures 105 may individually horizontally extend between and be employed by transistors of the control logic devices 109 within the control logic region 102 of the first microelectronic device structure 100. The gate structures 105 may be formed of and include conductive material. A gate dielectric material (e.g., a dielectric oxide) may vertically intervene (e.g., in the Z-direction) between the gate structures 105 and channel regions (e.g., within the semiconductive base structure 104) of the transistors.

As shown in FIG. 1A, the first signal routing structures 106 may vertically overlie (e.g., in the Z-direction) the semiconductive base structure 104, and may be electrically connected to the semiconductive base structure 104 by way of the first interconnect structures 108. Some of the first interconnect structures 108 may vertically extend between and electrically couple some of the first signal routing structures 106, and other of the first interconnect structures 108 may vertically extend between and electrically couple regions (e.g., conductively doped regions, such as source regions and drain regions) of the semiconductive base structure 104 to one or more of the first signal routing structures 106. The first signal routing structures 106 and the first interconnect structures 108 may each individually be formed of and include conductive material.

As described above, portions of the semiconductive base structure 104 (e.g., conductively doped regions serving as source regions and drain regions, undoped regions serving as channel regions), the gate structures 105, the first signal routing structures 106, and the first interconnect structures 108 form various control logic devices 109 of the control logic region 102. The control logic devices 109 may be configured to control various operations of other components (e.g., memory cells of a memory cell array) of a relatively larger assembly to include the first microelectronic device structure 100, as described in further detail below. Stated another way, the control logic devices 109 may be configured to effectuate at least a portion of control operations of the components (e.g., the memory cells of the memory cell array). As a non-limiting example, the control logic devices 109 may include one or more (e.g., each) of charge pumps (e.g., $V_{CCP}$ charge pumps, $V_{NEGWL}$ charge pumps, DVC2 charge pumps), DLL circuitry (e.g., ring oscillators), $V_{dd}$ regulators, string drivers, page buffers, and various chip/deck control circuitry. As another non-limiting example, the control logic devices 109 may include devices configured to control column operations for arrays (e.g., memory element array(s), access device array(s)) within a memory array region of another (e.g., second) microelectronic device structure to be coupled to the first microelectronic device structure 100, such as one or more (e.g., each) of decoders (e.g., local deck decoders, column decoders), sense amplifiers (e.g., EQ amplifiers, ISO amplifiers, NSAs, PSAs), repair circuitry (e.g., column repair circuitry), I/O devices (e.g., local I/O devices), memory test devices, MUX, and ECC devices. As a further non-limiting example, the control logic devices 109 may include devices configured to control row operations for arrays (e.g., memory element array(s), access device array(s)) within the memory array region of the another microelectronic device structure to be coupled to the first microelectronic device structure 100, such as one or more (e.g., each) of decoders (e.g., local deck decoders, row decoders), drivers (e.g., WL drivers), repair circuitry (e.g., row repair circuitry), memory test devices, MUX, ECC devices, and self-refresh/wear leveling devices.

With combined reference to FIG. 1A and FIG. 1B, the first microelectronic device structure 100 may further include first bond pad structures 110, second bond pad structures 112 (shown in FIG. 1B), and second interconnect structures 114 vertically overlying and in electrical communication with the first signal routing structures 106 of the control logic region 102. As shown in FIG. 1A, the first bond pad structures 110 and the second bond pad structures 112 may vertically overlie the first signal routing structures 106, and the second interconnect structures 114 may vertically extend between and electrically connect the first signal routing structures 106 to each of the first bond pad structures 110 and the second bond pad structures 112. The first bond pad structures 110, the second bond pad structures 112, and the second interconnect structures 114 may each individually be formed of and include conductive material. In some embodiments, the first bond pad structures 110 comprise the same material composition as the second bond pad structures 112. In some embodiments, the first bond pad structures 110 and the second bond pad structures 112 comprise the copper.

As will be described herein, the second bond pad structures 112 may comprise so-called "dummy" bond pad structures and may not be in electrical communication with one or more components of the first microelectronic device structure 100, such as one of the second interconnect structures 114 or one or more of the first signal routing structures 106. The first bond pad structures 110 may comprise so-called "active" bond pad structures that are in electrical communication with one or more components of the first microelectronic device structure 100.

As will be further described herein, at least some of the first bond pad structures 110 may be used to couple (e.g., bond) the first microelectronic device structure 100 to an additional microelectronic device structure (e.g., a second microelectronic device structure 150 (FIG. 1C, FIG. 1D)) to form a relatively larger assembly including the first microelectronic device structure 100 and the additional microelectronic device structure. In some embodiments, the second bond pad structures 112 may not be directly coupled to corresponding bond pad structures of another microelectronic device structure.

The first bond pad structures 110 and the second bond pad structures 112 may be collectively referred to herein as "bond pad structures" of the first microelectronic device structure 100. The first bond pad structures 110 and the second bond pad structures 112 may be arranged in rows 115 extending in a first lateral direction (e.g., the X-direction) and columns 117 extending in a second lateral direction (e.g., the Y-direction).

With continued reference to FIG. 1A and FIG. 1B, the first microelectronic device structure 100 may include second signal routing structures 116 laterally neighboring (e.g., in the X-direction, in the Y-direction) at least some of the first bond pad structures 110 and the second bond pad structures 112. In some embodiments, the second signal routing structures 116 are substantially vertically (e.g., in the Z-direction) co-planar with the first bond pad structures 110 and the second bond pad structures 112. Stated another way, the second signal routing structures 116 are vertically aligned with the first bond pad structures 110 and the second bond pad structures 112.

In some embodiments, the second signal routing structures 116 may overlie from about ten percent of an area of the first microelectronic device structure 100 to about ninety percent of the area of an upper surface of the first microelectronic device structure 100, such as from about ten percent to about thirty percent, from about thirty percent to about fifty percent, from about fifty percent to about seventy percent, or from about seventy percent to about ninety percent of the area of the first microelectronic device structure 100.

The second signal routing structures 116 may be formed of and include conductive material. In some embodiments, the second signal routing structures 116 comprise copper. In other embodiments, the second signal routing structures 116 comprise tungsten.

As will be described herein, in some embodiments, the second signal routing structures 116 may not directly contact a corresponding structure (e.g., a routing structure, a bond pad structure) on an additional microelectronic device structure to which the first microelectronic device structure 100 is coupled.

The second signal routing structures 116 may be configured to facilitate electrical connection between various components (e.g., one or more of transistors, one or more of the first control logic devices 109) of the first microelectronic device structure 100. For example, the second signal routing structures 116 may facilitate routing of electrical signals between one or more structures and components of the first microelectronic device structure 100. In some embodiments, the second signal routing structures 116 are configured to route signals associated with one or more of the first control logic devices 109 to one or more components (e.g., memory cells) of an additional microelectronic device structure.

The second signal routing structures 116 may be electrically coupled to at least some of the first signal routing structures 106 by means of the second interconnect structures 114. In some embodiments, at least some of the second signal routing structures 116 are electrically coupled to at least some of the first signal routing structures 106 directly vertically neighboring (e.g., in the Z-direction) the second signal routing structures 116 and at least others of the second signal routing structures 116 may be directly electrically coupled to at least some of the first signal routing structures 106 that are not directly vertically neighboring (e.g., in the Z-direction) the second signal routing structures 116. Second signal routing structures 116 that are not directly electrically coupled to directly vertically neighboring first signal routing structures 106 may be referred to as "skipping" a vertically neighboring routing structure.

The second signal routing structures 116 may comprise lines that extend in one or more directions (e.g., the X-direction, the Y-direction, both the X-direction and the Y-direction). For example, some of the second signal routing structures 116 extend in the Y-direction; others of the second signal routing structures 116 extend in the X-direction; and yet others of the second signal routing structures 116 extend in the X-direction and the Y-direction.

With reference to FIG. 1B, each of the first bond pad structures 110 may individually laterally neighbor (e.g., in the X-direction, in the Y-direction) one or more of other first bond pad structures 110, second bond pad structures 112, and second signal routing structures 116. Each of the second bond pad structures 112 may individually laterally neighbor (e.g., in the X-direction, in the Y-direction) one or more of other second bond pad structures 112, first bond pad structures 110, and second signal routing structures 116. Each of the second signal routing structures 116 may individually laterally neighbor (e.g., in the X-direction, in the Y-direction) one or more other second signal routing structures 116, first bond pad structures 110, and second bond pad structure 112.

A pitch $P_1$ (e.g., a distance between a feature of a structure to a corresponding feature of a neighboring structure) of the bond pad structures (e.g., the first bond pad structures 110 and the second bond pad structures 112) of the first microelectronic device structure 100 may be within a range from about 0.5 micrometer (μm) to about 5.0 μm, such as from about 0.5 μm to about 1.0 μm, from about 1.0 μm to about 2.0 μm, from about 2.0 μm to about 3.0 μm, from about 3.0 μm to about 4.0 μm, or from about 4.0 μm to about 5.0 μm. In some embodiments, the pitch $P_1$ is from about 1.0 μm to about 2.0 μm. In some embodiments, the pitch $P_1$ is about 1.0 μm.

A pitch $P_2$ of the second signal routing structures 116 may be within a range from about 0.1 μm to about 1.0 μm, such as from about 0.1 μm to about 0.2 μm, from about 0.2 μm to about 0.4 μm, from about 0.4 μm to about 0.6 μm, from about 0.6 μm to about 0.8 μm, or from about 0.8 μm to about 1.0 μm. In some embodiments, the pitch $P_2$ is less than the pitch $P_1$. In some embodiments, the pitch $P_2$ is from about 0.1 μm to about 0.5 μm.

With continued reference to FIG. 1A and FIG. 1B, a dielectric material 118 may electrically isolate neighboring components (e.g., the gate structures 105, the first signal routing structures 106, the first interconnect structures 108, the first bond pad structures 110, the second bond pad structures 112, the second interconnect structures 114, the second signal routing structures 116) of the first microelectronic device structure 100 from each other. The dielectric material 118 may be formed of and include insulative material. In some embodiments, the dielectric material 118 comprises silicon dioxide.

Figure 1C:
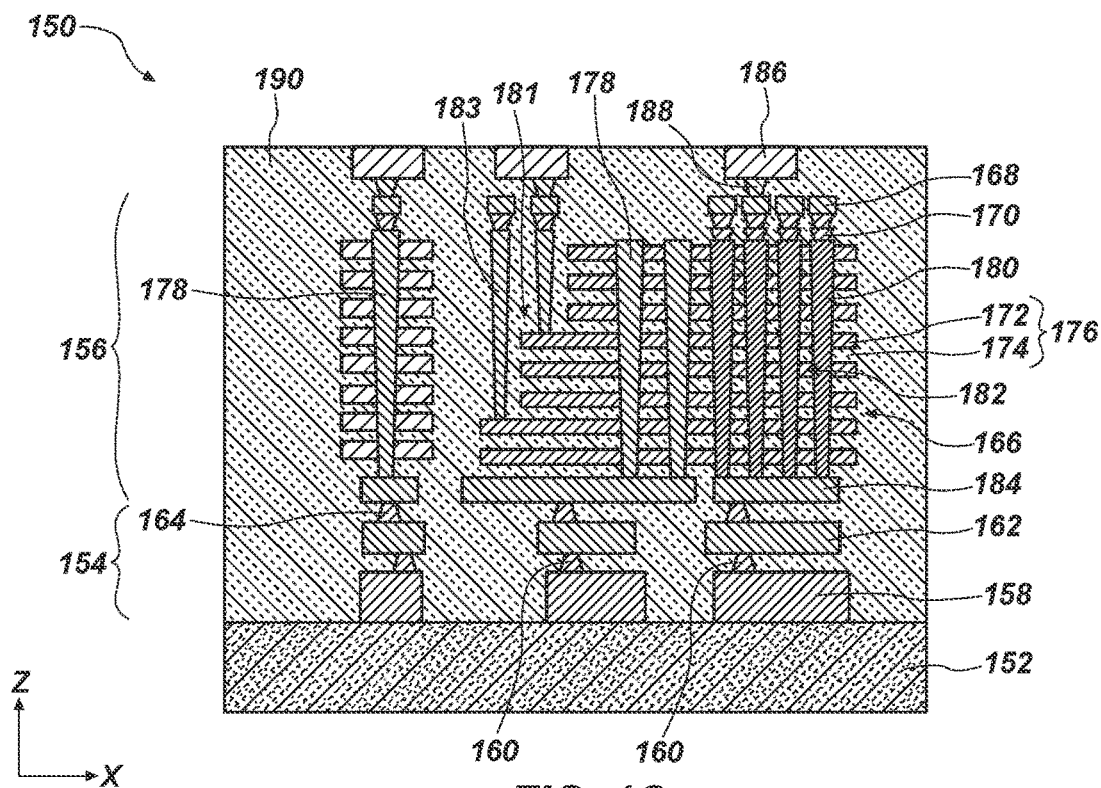
FIG. 1C is a simplified partial cross-sectional view of a second microelectronic device structure, in accordance with embodiments of the disclosure.

Referring now to FIG. 1C, a second microelectronic device structure 150 (e.g., a second chiplet, a second die) may be formed to include a base structure 152 (e.g., a base wafer, a support wafer), an interconnect region 154 vertically over (e.g., in the Z-direction), and a memory array region 156 vertically over (e.g., in the Z-direction) the base structure 152 and in electrical communication with the interconnect region 154. In some embodiments, the interconnect region 154 is vertically interposed between the base structure 152 and the memory array region 156.

The base structure 152 may comprise a base material or construction upon which additional materials and structures of the second microelectronic device structure 150 are formed. The base structure 152 may be a conventional silicon substrate (e.g., a conventional silicon wafer), or another bulk substrate. By way of non-limiting example, a base structure 152 may comprise one or more of silicon, silicon dioxide, silicon with native oxide, silicon nitride, a carbon-containing silicon nitride, glass, semiconductor, metal oxide, metal, titanium nitride, carbon-containing titanium nitride, tantalum, tantalum nitride, carbon-containing tantalum nitride, niobium, niobium nitride, carbon-containing niobium nitride, molybdenum, molybdenum nitride, carbon-containing molybdenum nitride, tungsten, tungsten nitride, carbon-containing tungsten nitride, Cu, Co, Ni, Fe, Al, and a noble metal. In some embodiments, the base structure 152 comprises a silicon wafer.

The interconnect region 154 may include bond pad structures 158 vertically overlying the base structure 152, third interconnect structures 160 vertically overlying (e.g., in the Z-direction) the bond pad structures 158, third routing structures 162 vertically overlying (e.g., in the Z-direction) the third interconnect structures 160, and fourth interconnect structures 164 vertically overlying (e.g., in the Z-direction) the third routing structures 162. Each of the bond pad structures 158, the third interconnect structures 160, the third routing structures 162, and the fourth interconnect structures 164 may individually be formed of and include conductive material.

The memory array region 156 of the second microelectronic device structure 150 may include a stack structure 166, line structures 168 (e.g., digit line structures, bit line structures), and line contact structures 170. As shown in FIG. 1C, the line structures 168 may vertically overlie (e.g., in the Z-direction) the stack structure 166, and may be electrically connected to structures (e.g., pillar structures, such as cell pillar structures; filled vias, such as through vias filled with conductive material) within the stack structure 166 by way of the line contact structures 170. The line contact structures 170 may vertically extend between and electrically couple individual line structures 168 and individual structures within the stack structure 166. The line structures 168 and the line contact structures 170 may each individually be formed of and include conductive material.

The stack structure 166 of the memory array region 156 includes a vertically alternating (e.g., in the Z-direction) sequence of conductive structures 172 and insulative structures 174 arranged in tiers 176. Each of the tiers 176 of the stack structure 166 may include at least one of the conductive structures 172 vertically neighboring at least one of the insulative structures 174. In some embodiments, the conductive structures 172 are formed of and include tungsten (W) and the insulative structures 174 are formed of and include silicon dioxide ($SiO_2$). The conductive structures 172 and insulative structures 174 of the tiers 176 of the stack structure 166 may each individually be substantially planar, and may each individually exhibit a desired thickness.

The memory array region 156 further includes additional structures and/or devices on, over, and/or within the stack structure 166. As a non-limiting example, the memory array region 156 includes cell pillar structures 180 vertically extending through the stack structure 166. The cell pillar structures 180 may each individually include a semiconductive pillar (e.g., a polysilicon pillar, a silicon-germanium pillar) at least partially surrounded by one or more charge storage structures (e.g., a charge trapping structure, such as a charge trapping structure comprising an oxide-nitride-oxide ("ONO") material; floating gate structures). Intersections of the cell pillar structures 180 and the conductive structures 172 of the tiers 176 of the stack structure 166 may define vertically extending strings of memory cells 182 coupled in series with one another within the memory array region 156 of the second microelectronic device structure 150. In some embodiments, the memory cells 182 formed at the intersections of the conductive structures 172 and the cell pillar structures 180 within each of the tiers 176 of the stack structure 166 comprise so-called "MONOS" (metal-oxide-nitride-oxide-semiconductor) memory cells. In additional embodiments, the memory cells 182 comprise so-called "TANOS" (tantalum nitride-aluminum oxide-nitride-oxide-semiconductor) memory cells, or so-called "BETANOS" (band/barrier engineered TANOS) memory cells, each of which are subsets of MONOS memory cells. In further embodiments, the memory cells 182 comprise so-called "floating gate" memory cells including floating gates (e.g., metallic floating gates) as charge storage structures. The floating gates may horizontally intervene between central structures of the cell pillar structures 180 and the conductive structures 172 of the different tiers 176 of the stack structure 166.

The conductive structures 172 may be referred to as "word line" or "access line" structures (e.g., local word line structures) for the memory cells 182 within the memory array region 156. The memory array region 156 may further include steps 181 (only some of which are illustrated for clarity and ease of understanding of the description) at lateral edges of the conductive structures 172. Conductive contact structures 183 may be electrically coupled to each of the conductive structures 172 and may be configured to transmit a voltage to the conductive structures 172 during use and operation of the memory cells 182 of the cell pillar structures 180.

At least one source structure 184 may vertically underlie (e.g., in the Z-direction) the tiers 176 of the conductive structures 172 and the insulative structures 174. In some embodiments, the cell pillar structures 180 are in electrical communication with the source structure 184. The source structure 184 may be formed of and include conductive material, such as one or more of doped silicon (e.g., doped polysilicon), tungsten silicide ($WSi_x$), tungsten nitride, and tungsten silicon nitride ($WSi_xN_y$). In some embodiments, the source structure 184 is formed of and includes doped silicon.

The cell pillar structures 180 may vertically extend from an upper vertical boundary of the stack structure 166, through the stack structure 166, and to a location at or proximate an upper vertical boundary of a source structure 184.

As shown in FIG. 1C, at least one deep contact structure 178 may vertically extend through the stack structure 166. The deep contact structure(s) 178 may be configured and positioned to electrically connect one or more components of the second microelectronic device structure 150 vertically overlying the stack structure 166 with one or more components of the second microelectronic device structure 150 vertically underlying the stack structure 166. The deep contact structure(s) 178 may be formed of and include conductive material.

With continued reference to FIG. 1C, components of the memory array region 156 of the second microelectronic device structure 150 may be electrically connected to components (e.g., structures, such as third bond pad structures 186) by way of fifth interconnect structures 188. As will be described herein, the third bond pad structures 186 may be electrically connected to at least some of the first bond pad structures 110 (FIG. 1A, FIG. 1B) of the first microelectronic device structure 100.

The components of the second microelectronic device structure 150 may be electrically isolated from one another by a dielectric material 190. The dielectric material 190 may be formed of and include an insulative material. In some embodiments, the dielectric material 190 comprises silicon dioxide.

Figure 1D:
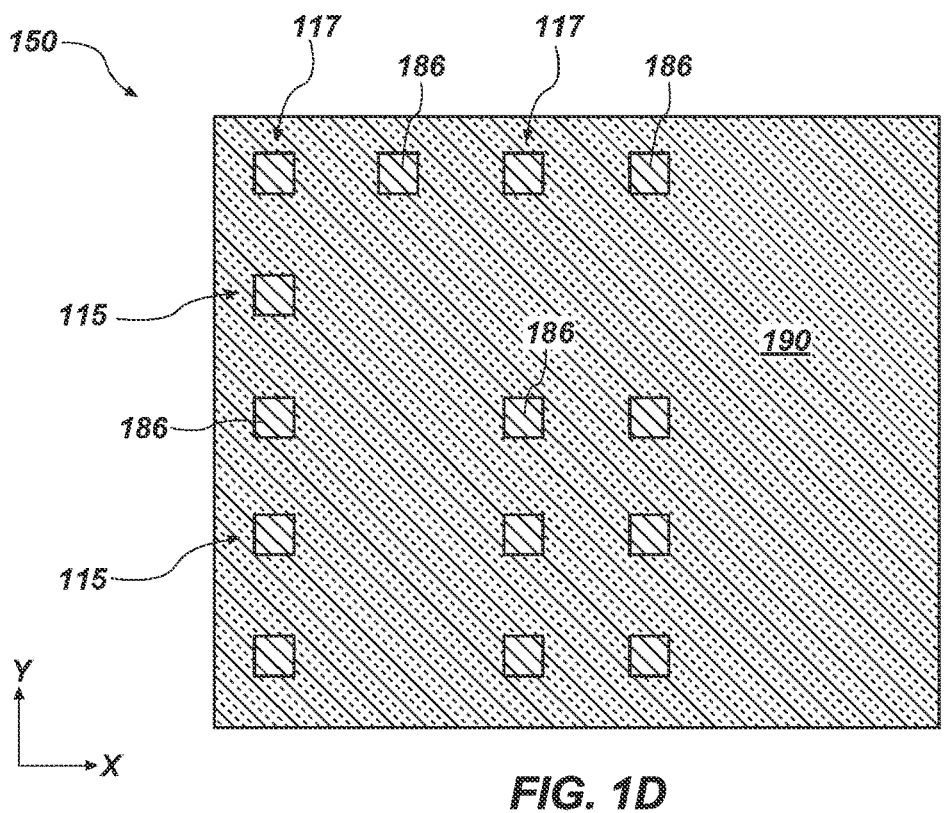
FIG. 1D is a simplified partial top down view of the second microelectronic device structure of FIG. 1C.

FIG. 1D is a simplified partial top view of the second microelectronic device structure 150 of FIG. 1C. As shown in FIG. 1D, locations of the third bond pad structures 186 may correspond to locations of at least some of the first bond pad structures 110 (FIG. 1A, FIG. 1B) and the second bond pad structures 112 (FIG. 1A, FIG. 1B) of the first microelectronic device structure 100 (FIG. 1A, FIG. 1B). Stated another way, the pattern of the third bond pad structures 186 may correspond to the pattern of the first bond pad structures 110 and the second bond pad structures 112 of the first microelectronic device structure 100. In some embodiments, a pitch of the third bond pad structures 186 may correspond to the pitch $P_1$ (FIG. 1B) of the first bond pad structures 110 (FIG. 1B) and the second bond pad structures 112 (FIG. 1B).

Figure 1E:
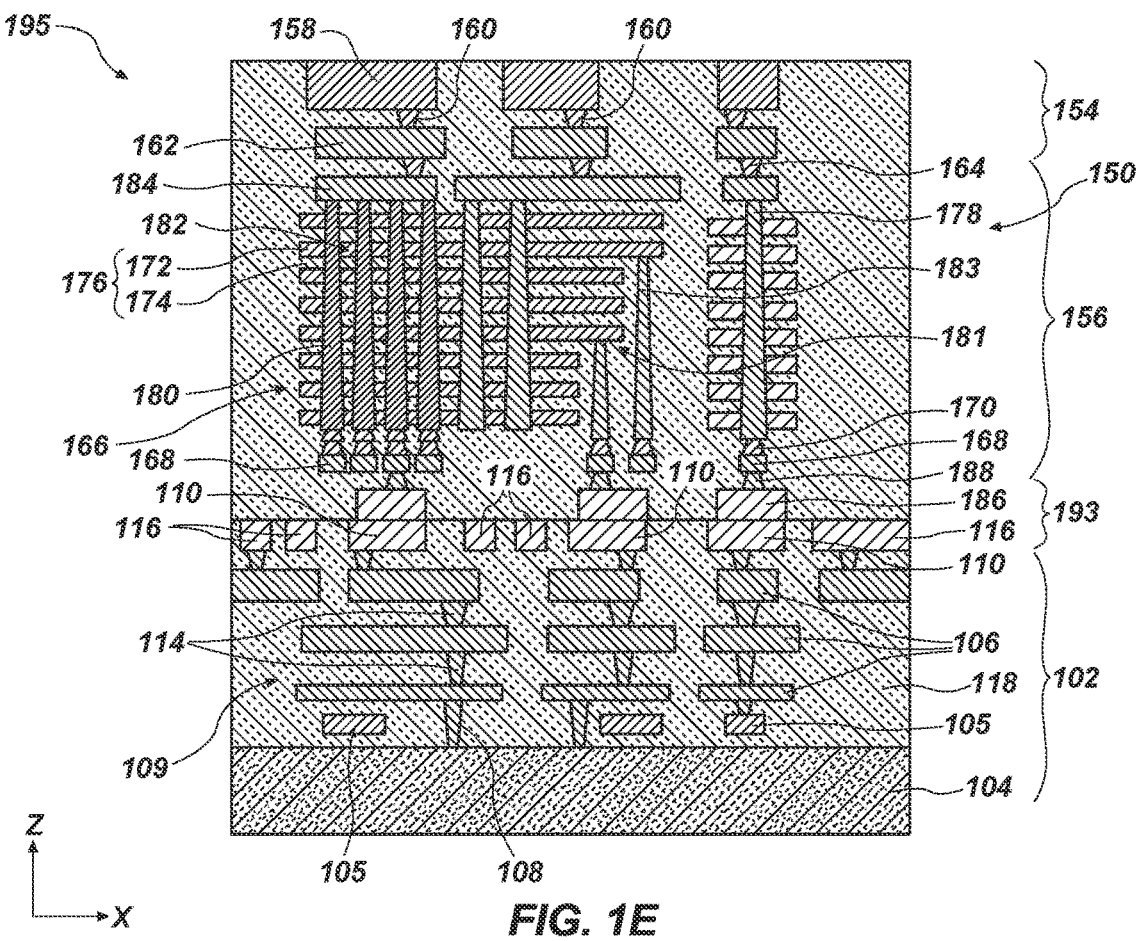
FIG. 1E is a simplified partial cross-sectional view of a microelectronic device structure assembly, in accordance with embodiments of the disclosure.

Referring now to FIG. 1E, the second microelectronic device structure 150 may be vertically inverted (e.g., flipped upside down in the Z-direction) and attached (e.g., bonded) to the first microelectronic device structure 100 to form a microelectronic device structure assembly 195 comprising the first microelectronic device structure 100 and the second microelectronic device structure 150. For example, the base structure 152 (FIG. 1C) may be removed (e.g., detached) from the second microelectronic device structure 150, and a carrier structure (e.g., a carrier wafer) may be attached (e.g., bonded) to the bond pad structures 158 by way of an adhesive material. The carrier structure and the adhesive material may be configured to facilitate safe handling of the second microelectronic device structure 150 for further processing (e.g., attachment to the first microelectronic device structure 100 to the second microelectronic device structure 150). The carrier structure and the adhesive material may respectively comprise a conventional carrier structure (e.g., a conventional carrier wafer) and a conventional adhesive material, and are thus not described in detail herein. In addition, the base structure 152 may be removed from the second microelectronic device structure 150 using conventional removal processes (e.g., conventional detachment processes, conventional grinding processes) and conventional equipment, which are also not described in detail herein.

After removing the base structure 152, the second microelectronic device structure 150 may be attached (e.g., bonded) to the first microelectronic device structure 100 to form the microelectronic device structure assembly 195, and the carrier structure and the adhesive material may be removed. The microelectronic device structure assembly 195 may be formed by laterally aligning and physically contacting the third bond pad structures 186 of the second microelectronic device structure 150 with the first bond pad structures 110 and the second bond pad structures 112 of the first microelectronic device structure 100 and performing at least one thermocompression process to bond the third bond pad structures 186 to the respective ones of the first bond pad structures 110 and the second bond pad structures 112.

Attaching the first microelectronic device structure 100 to the second microelectronic device structure 150 may form a bond pad region 193 between the first microelectronic device structure 100 and the second microelectronic device structure 150. The bond pad region 193 may include the first bond pad structures 110, the second bond pad structures 112, the third bond pad structures 186, and the second signal routing structures 116.

Figure 1F:
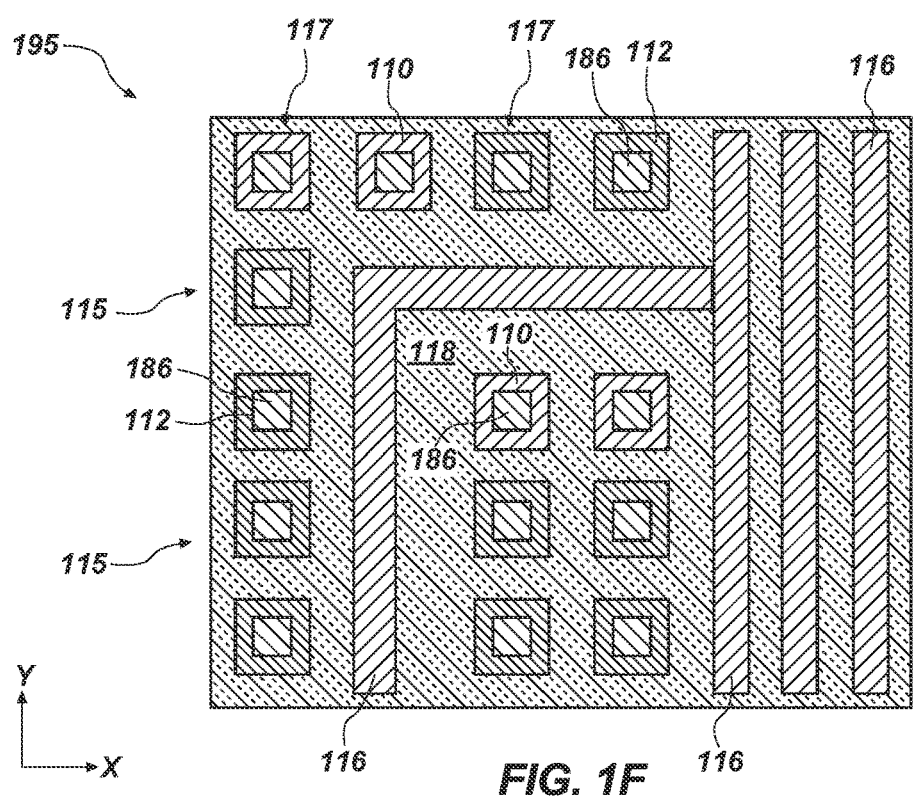
FIG. 1F is a simplified partial top down view of the microelectronic device structure assembly of FIG. 1E taken through a bond pad region.

FIG. 1F is a simplified cross-sectional view of the microelectronic device structure assembly 195 taken through the bond pad region 193 at an interface between the first microelectronic device structure 100 and the second microelectronic device structure 150. As illustrated in FIG. 1F, the first bond pad structures 110 and the second bond pad structures 112 of the first microelectronic device structure 100 may be electrically coupled to corresponding third bond pad structures 186 of the second microelectronic device structure 150. In some embodiments, the third bond pad structures 186 may be located within lateral boundaries of the first bond pad structures 110 and the second bond pad structures 112. However, the disclosure is not so limited, and in other embodiments, the area of the third bond pad structures 186 may be substantially the same or may be greater than the area of the first bond pad structures 110 and the second bond pad structures 112.

In some embodiments, the second signal routing structures 116 of the first microelectronic device structure 100 may not be electrically coupled to corresponding structures on the second microelectronic device structure 150. The second signal routing structures 116 may be located within the bond pad region 193 and may include at least one surface that is vertically aligned with at least one surface of each of the first bond pad structures 110, the second bond pad structures 112, and the third bond pad structures 186.

In some embodiments, portions of the area of the first microelectronic device structure 100 may be used to route (e.g., convey) signals from one or more components of the first microelectronic device structure 100 by means of the second signal routing structures 116. In some embodiments, the second signal routing structures 116 may convey signals from one or more of the control logic devices 109 to one or more components of the cell pillar structures 180 including the memory cells 182. By way of non-limiting example, the signals conveyed by the second signal routing structures 116 may include signals from the control logic devices 109 for performing one or more row operations for the memory cells 182 of the cell pillar structures 180, column operations, and operations of one or more of decoders, string drivers, page buffers, and various chip/deck control circuitry. Of course, the disclosure is not so limited and the signals carried by the second signal routing structures 116 may be different than those described.

Since various locations of the first microelectronic device structure 100 do not include the first bond pad structures 110 or the second bond pad structures 112, and various locations of the second microelectronic device structure 150 do not include the third bond pad structures 186, the first microelectronic device structure 100 may be formed to include the second signal routing structures 116 at such locations. Stated another way, since the bond pad region 193 does not include bond pad structures (e.g., the first bond pad structures 110, the second bond pad structures 112, and the third bond pad structures 186) over an entire area of the bond pad region 193 (e.g., since areas of the bond pad region 193 do not include the bond pad structures), portions of the bond pad region 193 may include the second signal routing structures 116 of the first microelectronic device structure 100 and may be configured to route one or more signals of the first microelectronic device structure 100 to one or more locations. In some embodiments, the pitch $P_2$ of the second signal routing structures 116 may be less than the pitch $P_1$ of the bond pad structures (e.g., the first bond pad structures 110 and the second bond pad structures 112) of the first microelectronic device structure 100. Since the second signal routing structures 116 may not be coupled to corresponding components on the surface of the second microelectronic device structure 150, the pitch $P_1$ may not be limited by alignment tolerances of the process by which the first microelectronic device structure 100 is bonded to the second microelectronic device structure 150.

Incorporating the second signal routing structures 116 in the bond pad region 193 may facilitate an increase in the density of signal routing structures of the microelectronic device structure assembly 195 compared to conventional microelectronic device structures that do not include signal routing structures in bond pad regions (e.g., at an interface between microelectronic device structures). For example, conventional microelectronic device structures may include active bond pad structures less than about ten (10) percent of the area of the microelectronic device structure, while remaining portions of the microelectronic device structure include dummy bond pad structures or do not include structures. By way of comparison, the microelectronic device structure assembly 195 may include the second signal routing structures 116 in the bond pad region 193.

Although FIG. 1A through FIG. 1F have been described and illustrated as comprising the second microelectronic device structure 150 including the line structures 168 vertically (e.g., in the Z-direction) interposed between the third bond pad structures 186 and the stack structure 166, the disclosure is not so limited. In other embodiments, the stack structure 166 may be vertically interposed between the line structures 168 and the third bond pad structures 186.

Figure 2:
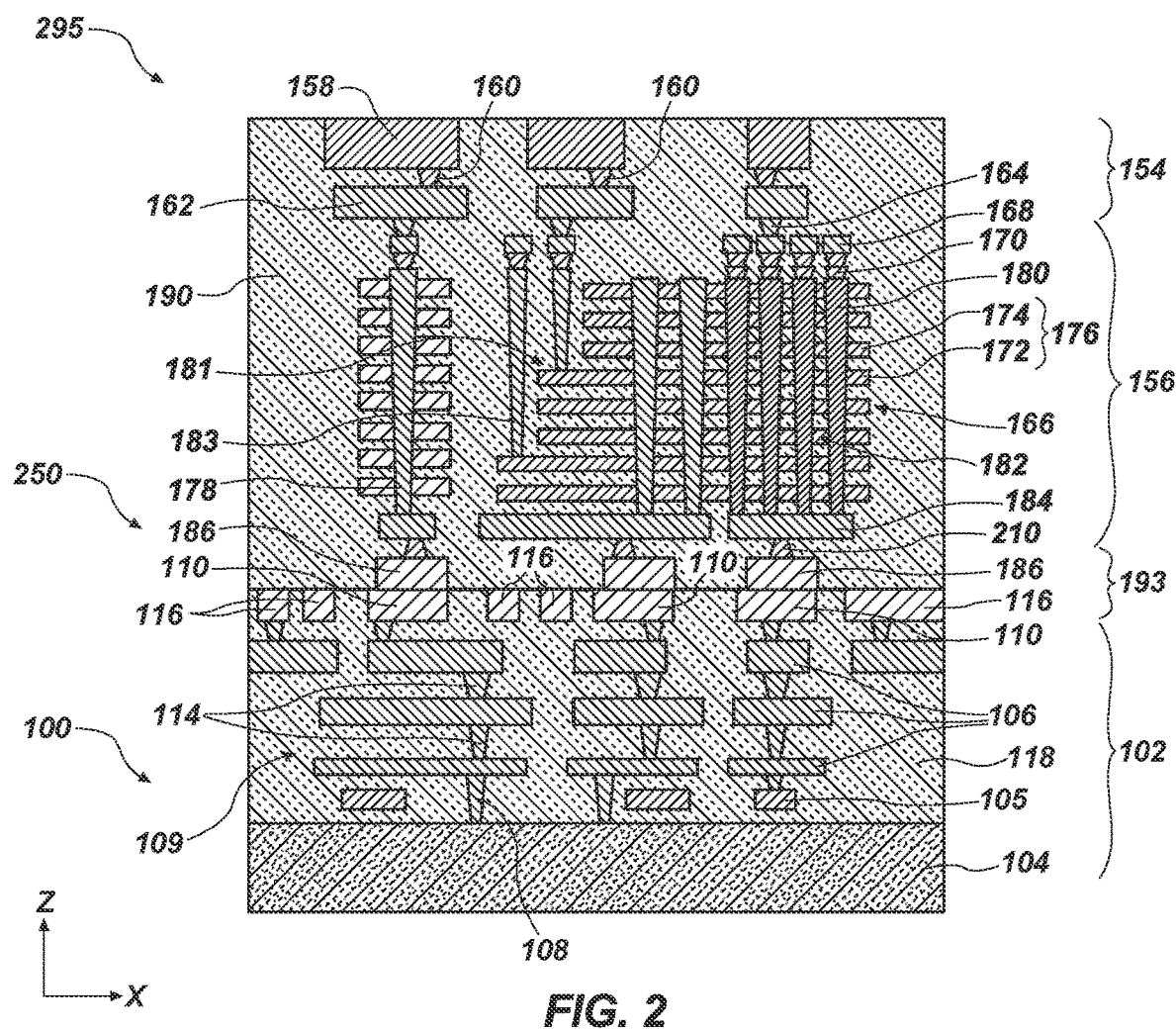
FIG. 2 is a simplified partial cross-sectional view of a microelectronic device structure assembly, in accordance with embodiments of the disclosure.

FIG. 2 is a simplified partial cross-sectional view of a microelectronic device structure assembly 295 including the first microelectronic device structure 100 and a second microelectronic device structure 250 coupled to the first microelectronic device structure 100. The second microelectronic device structure 250 may be substantially the same as the second microelectronic device structure 150 of FIG. 1C, except that the second microelectronic device structure 250 may include the source structure 184 vertically interposed between the stack structure 166 and the third bond pad structures 186.

The source structure 184 may be coupled to the third bond pad structures 186 by sixth interconnect structures 210. The sixth interconnect structures 210 may be formed of and include conductive material. For example, the sixth interconnect structures 210 may comprise tungsten.

The line structures 168 may vertically overlie (e.g., in the Z-direction) the stack structure 166. In some embodiments, the line contact structures 170 may vertically intervene and contact the line structures 168 and components of the stack structure 166 (e.g., the deep contact structures 178, the cell pillar structures 180).

With continued reference to FIG. 2, the fourth interconnect structures 164 may vertically overlie the line structures 168 and electrically couple the line structures 168 to the third routing structures 162. The third routing structures 162 may be electrically coupled to the bond pad structures 158 by vertically intervening third interconnect structures 160.

Although the microelectronic device structure assembly 195 (FIG. 1E, FIG. 1F), and the microelectronic device structure assembly 295 (FIG. 2) have been described and illustrated as including the second signal routing structures 116 not contacting a corresponding structure on the second microelectronic device structure 150, 250, the disclosure is not so limited.

Figure 3A:
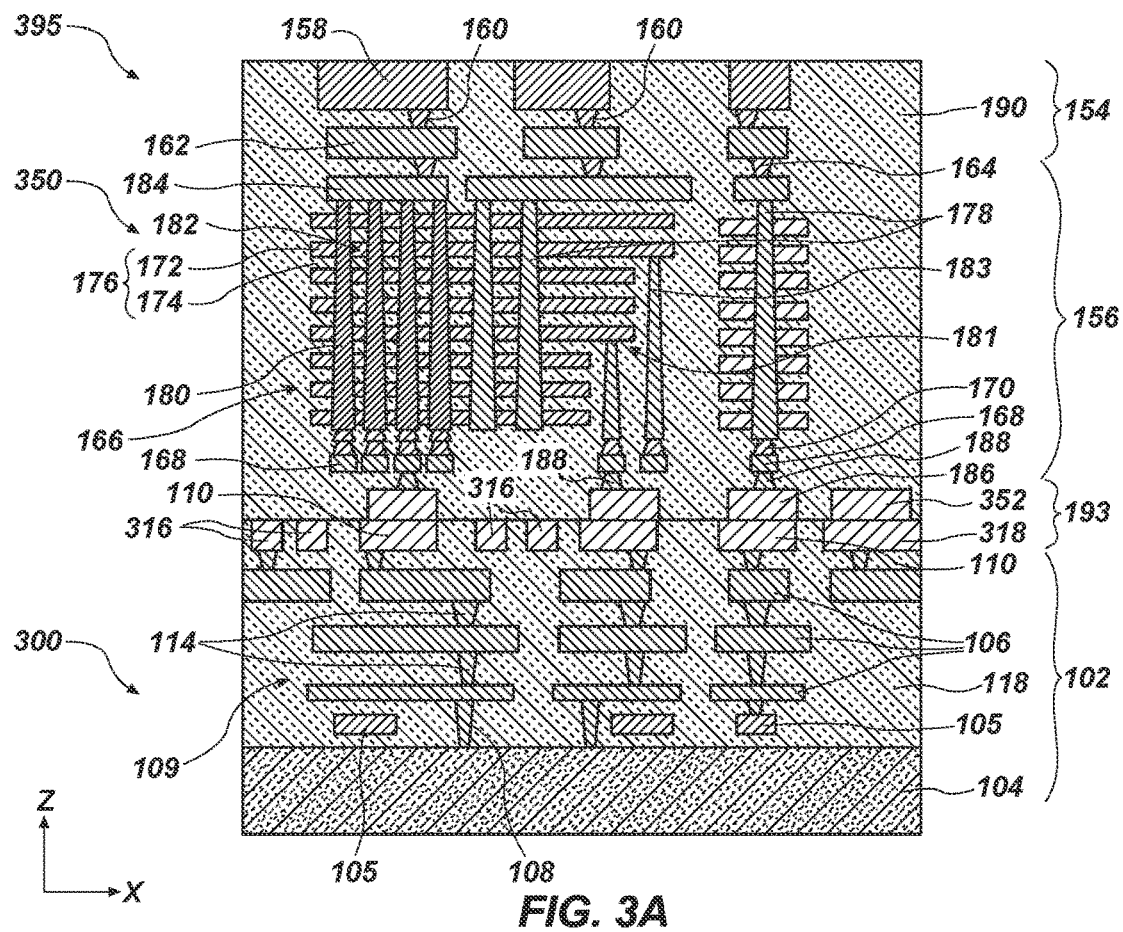
FIG. 3A is a simplified partial cross-sectional view of a microelectronic device structure assembly, in accordance with embodiments of the disclosure.
Figure 3B:
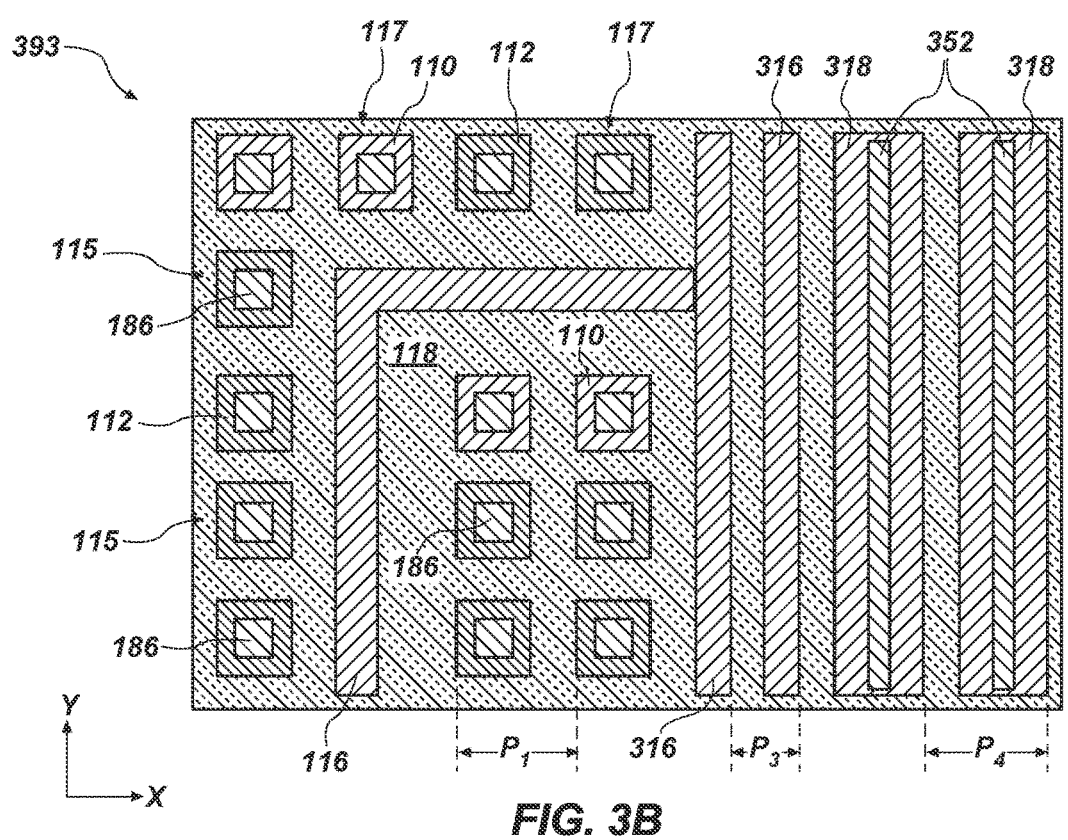
FIG. 3B is a simplified top view of a bond pad region of the microelectronic device structure assembly of FIG. 3A.

FIG. 3A is a simplified partial cross-sectional view of a microelectronic device structure assembly 395 including a first microelectronic device structure 300 and a second microelectronic device structure 350 attached (e.g., bonded) to the first microelectronic device structure 300. FIG. 3B is a simplified cross-sectional view of the microelectronic device structure assembly 395 illustrating a bond pad region 393 at an interface between the first microelectronic device structure 300 and the second microelectronic device structure 350.

The first microelectronic device structure 300 may be substantially similar to the first microelectronic device structure 100 (FIG. 1A, FIG. 1B), except that the first microelectronic device structure 300 may include second signal routing structures 316 having a first pitch $P_3$ and third signal routing structures 318 having a second pitch $P_4$ different than the first pitch $P_3$. The first pitch $P_3$ may correspond to the pitch $P_2$ (FIG. 1B) described above with reference to the second signal routing structures 116 (FIG. 1B). The second signal routing structures 316 may be substantially the same as the second signal routing structures 116 described above.

In some embodiments, the second pitch $P_4$ may correspond to the pitch $P_1$ between adjacent bond structures (e.g., the first bond pad structures 110 and the second bond pad structures 112) of the first microelectronic device structure 300. In some embodiments, the second pitch $P_4$ is greater than the first pitch $P_3$. In some embodiments, the second pitch $P_4$ may be greater than alignment tolerances of the process by which the first microelectronic device structure 300 is bonded to the second microelectronic device structure 350.

At least one surface of the second signal routing structures 316 and the third signal routing structures 318 may be vertically aligned (e.g., in the Z-direction) with at least one surface of the first bond pad structures 110 and the second bond pad structures 112. In addition, at least one surface of the second signal routing structures 316 and the third signal routing structures 318 may be vertically aligned with the third bond pad structures 186.

Accordingly, the first microelectronic device structure 300 may include signal routing structures (e.g., the second signal routing structures 316) having a different pitch (e.g., first pitch $P_3$) than the pitch (e.g., the second pitch $P_4$) of other signal routing structures (e.g., the third signal routing structures 318).

The second microelectronic device structure 350 may be substantially similar to the second microelectronic device structure 150 (FIG. 1C) or the second microelectronic device structure 250 (FIG. 2), except that the second microelectronic device structure 350 may include one or more additional signal routing structures 352 in the bond pad region 393. In some embodiments, the additional signal routing structures 352 are operably coupled to the third signal routing structures 318 and exhibit substantially the same pitch $P_4$ as the third signal routing structures 318. Accordingly, the third signal routing structures 318 of the first microelectronic device structure 300 may be electrically coupled to structures (e.g., the additional signal routing structures 352) of the second microelectronic device structure 350. In some embodiments, the second signal routing structures 316 of the first microelectronic device structure 300 may not be electrically coupled to a corresponding structure of the second microelectronic device structure 350.

The additional signal routing structures 352 may include at least one surface that is vertically aligned (e.g., in the Z-direction) with at least one surface of the third bond pad structures 186. In addition, the additional signal routing structures 352 may include at least one surface that is vertically aligned with at least one surface of the first bond pad structures 110, the second bond pad structures 112, the second signal routing structures 316, and the third signal routing structures 318.

In some embodiments, the third signal routing structures 318 may be configured to carry power bus signals and the second signal routing structures 316 are configured to carry one or more row operations for the memory cells 182 of the cell pillar structures 180, column operations, and operations of one or more of decoders, string drivers, page buffers, and various chip/deck control circuitry. Of course, the disclosure is not so limited and the signals carried by the second signal routing structures 316 and the third signal routing structures 318 may be different than those described.

In some embodiments, portions of the area of each of the first microelectronic device structure 300 and the second microelectronic device structure 350 may be used to route (e.g., convey) signals of one or more components of the respective first microelectronic device structure 300 and the second microelectronic device structure 350. Accordingly, each of the first microelectronic device structure 300 and the second microelectronic device structure 350 may include bond pad structures (e.g., the first bond pad structures 110, the second bond pad structures 112, and the third bond pad structures 186) that are located within the bond pad region 393, and may further include signal routing structures (e.g., the second signal routing structures 316, the third signal routing structures 318, and the additional signal routing structures 352) that are co-planar with the bond pad structures. Incorporating the signal routing structures in the bond pad region 393 may facilitate an increase in the density of the signal routing structures of the microelectronic device structure assembly 395 compared to conventional microelectronic device structures that do not include signal routing structures in bond pad regions. For example, conventional microelectronic device structures may include active bond pad structures less than about ten (10) percent of the area of the microelectronic device structure, while remaining portions of the microelectronic device structure are filled with dummy bond pad structures or do not include structures. By way of comparison, the microelectronic device structure assembly 395 may include the signal routing structures in the bond pad region 393, increasing a density of the signal routing structures of the microelectronic device structure assembly 395.

Figure 4A:
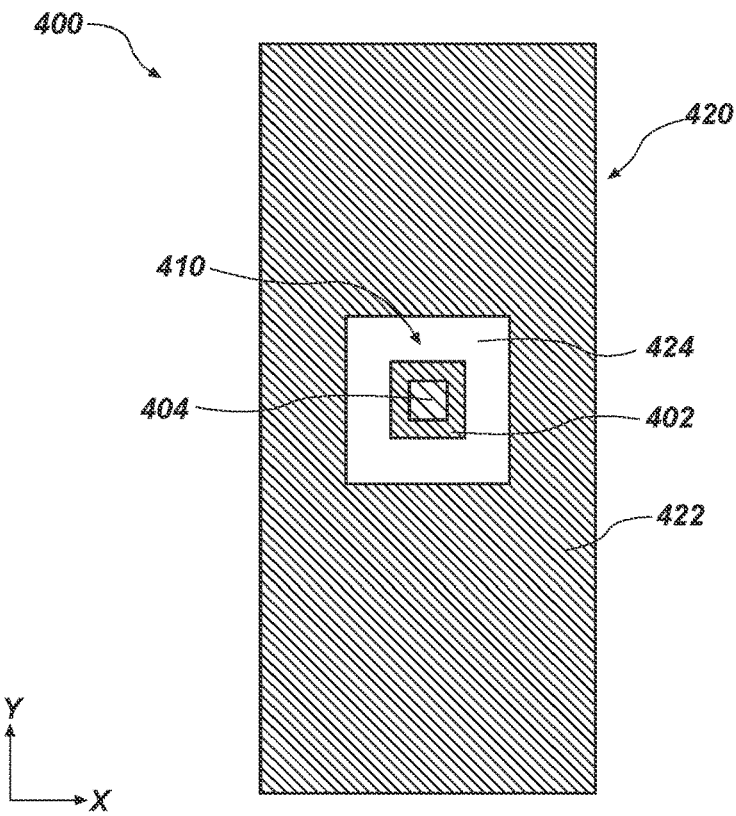
FIG. 4A and FIG. 4B are simplified top views of bond pad regions, in accordance with embodiments of the disclosure.

FIG. 4A is a simplified partial top down view of a portion of a bond pad region 400 (e.g., bond pad regions 193, 393) comprising a bond pad connection structure 410 comprising a first bond pad structure 402 (e.g., one or more of the first bond pad structures 110 (FIG. 1A, FIG. 1B, FIG. 1E, FIG. 1F, FIG. 2, FIG. 3A, FIG. 3B) and the second bond pad structures 112 (FIG. 1B, FIG. 1F)) of a first microelectronic device structure; a second bond pad structure 404 (e.g., the third bond pad structures 186 (FIG. 1C, FIG. 1D, FIG. 1E, FIG. 1F, FIG. 2, FIG. 3A, FIG. 3B)) of a second microelectronic device structure; and a first signal routing structure 420 (e.g., one or more of the second signal routing structures 116 (FIG. 1A, FIG. 1B, FIG. 1E, FIG. 1F), and the second signal routing structures 316 (FIG. 3A, FIG. 3B)) of one of the first microelectronic device structure and the second microelectronic device structure. The bond pad connection structure 410 may correspond to a connection between, for example, one of the first bond pad structures 110 or the second bond pad structures 112 and a third bond pad structure 186.

The bond pad region 400 may facilitate attachment of a first microelectronic device structure (e.g., the first microelectronic device structure 100, 300) to a second microelectronic device structure (e.g., the second microelectronic device structure 150, 250, 350). Each of the first bond pad structure 402 and the second bond pad structure 404 may be formed of and include conductive material.

The first signal routing structure 420 may be formed of and include a conductive material 422. In some embodiments, the conductive material 422 comprises the same material composition as one or both of the first bond pad structure 402 and the second bond pad structure 404. In some embodiments, the conductive material 422 is located on the same microelectronic device structure as one of the first bond pad structure 402 and the second bond pad structure 404.

The bond pad connection structure 410 may be located within the lateral boundaries of the first signal routing structure 420. In some embodiments, the bond pad connection structure 410 is located at a laterally central (e.g., in the X-direction) portion of the first signal routing structure 420. Accordingly, the first signal routing structure 420 may substantially surround the bond pad connection structure 410 and may be electrically isolated from the bond pad connection structure 410.

In some embodiments, the first signal routing structure 420 is electrically isolated from the bond pad connection structure 410 by a dielectric material 424. The dielectric material 424 may directly intervene between the first signal routing structure 420 and the bond pad connection structure 410. For example, the dielectric material 424 may be located between the first bond pad structure 402 and the first signal routing structure 420. The dielectric material 424 may be formed of and include an insulative material. In some embodiments, the dielectric material 424 comprises silicon dioxide.

Figure 4B:
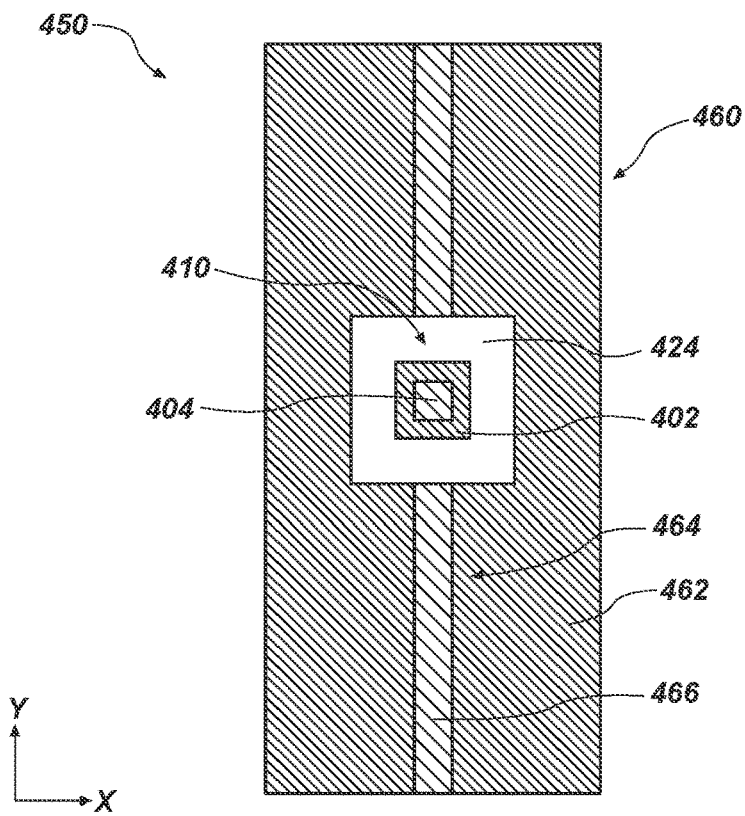

FIG. 4B is a simplified partial top down view of a portion of a bond pad region 450 (e.g., bond pad regions 193, 393), in accordance with additional embodiments of the disclosure. The bond pad region 450 may be substantially similar to the bond pad region 400 of FIG. 4A, except that the bond pad region 450 includes a second signal routing structure 460 including a first conductive material 462 (e.g., one of the third signal routing structure 318 (FIG. 3B)); and an additional signal routing structure 464 (e.g., the additional signal routing structure 352 (FIG. 3B)) comprising a second conductive material 466. The second signal routing structure 460 may be located on a first microelectronic device structure (e.g., the first microelectronic device structure 300 (FIG. 3A)) and the additional signal routing structure 464 may be located on a second microelectronic device structure (e.g., the second microelectronic device structure 350 (FIG. 3A)). In some embodiments, the first microelectronic device structure is in electrical communication with the second microelectronic device structure at least through electrical connection between the second signal routing structure 460 of the first microelectronic device structure and the additional signal routing structure 464 of the second microelectronic device structure. In addition, the first microelectronic device structure may be in electrical communication with the second microelectronic device structure through the bond pad connection structure 410.

In some embodiments, the second signal routing structure 460 and the first bond pad structure 402 are located on a first microelectronic device structure and the additional signal routing structure 464 and the second bond pad structure 404 are located on a second microelectronic device structure. The first conductive material 462 and the second conductive material 466 may be formed of and include conductive material. In some embodiments, the first conductive material 462 and the second conductive material 466 may comprise the same material composition.

Figure 5:
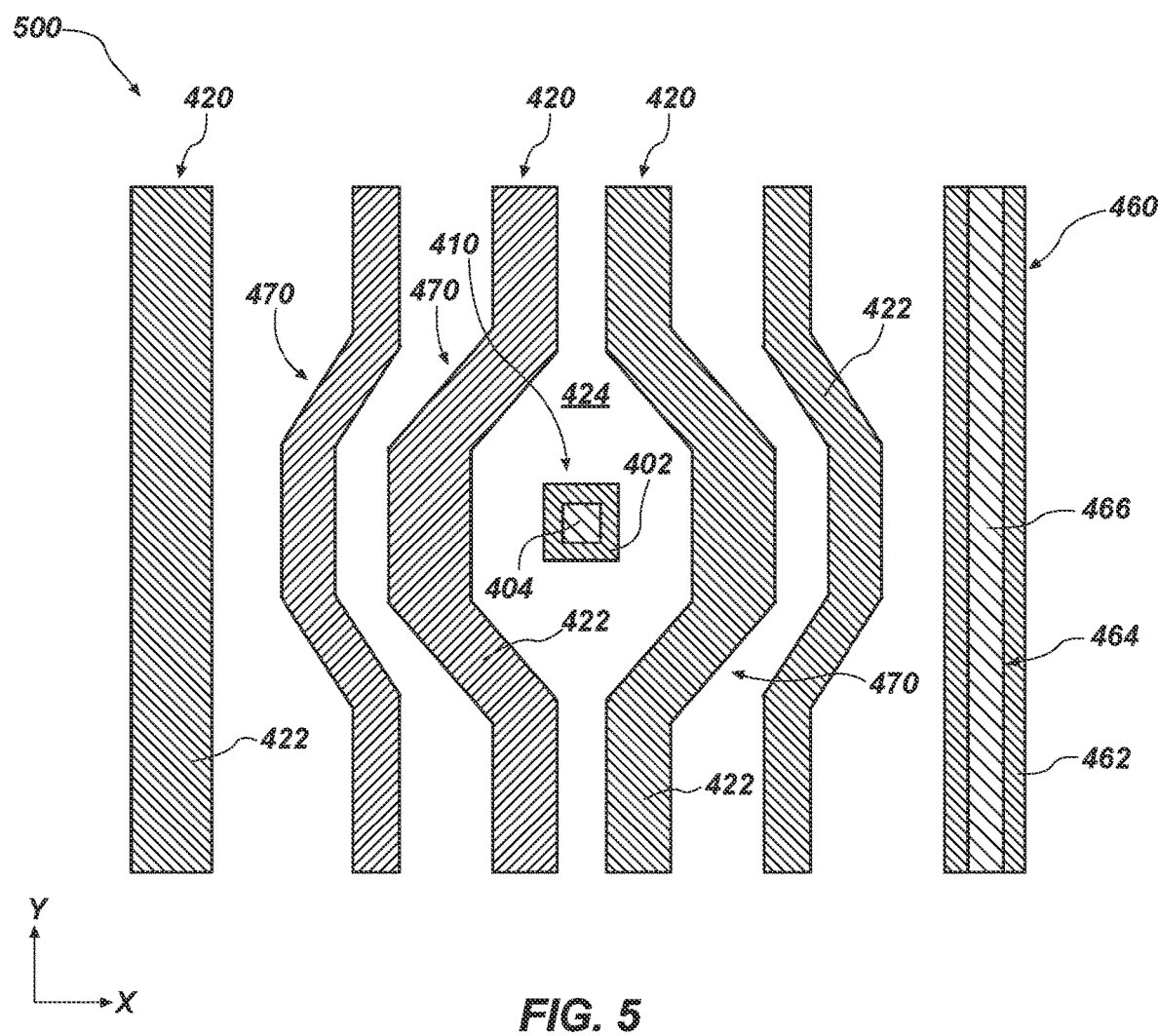
FIG. 5 is a simplified top view of a bond pad region, in accordance with other embodiments of the disclosure.

FIG. 5 is a simplified top down view of a bond pad region 500 (e.g., the bond pad region 193, 393), in accordance with additional embodiments of the disclosure. The bond pad region 500 may include a bond pad connection structure 410 that is substantially the same as the bond pad connection structure 410 described above with reference to FIG. 4A and FIG. 4B. The bond pad region 500 may further include first signal routing structures 420 that are substantially the same as the first signal routing structure 420 of FIG. 4A and one or more second signal routing structures 460 that are substantially the same as the second signal routing structure 460 of FIG. 4B.

With reference to FIG. 5, the bond pad region 500 may include one or more bond pad connection structures 410 that include a first bond pad structure 402 of a first microelectronic device structure operably coupled to a second bond pad structure 404 of a second microelectronic device structure. In addition, the bond pad region 500 may include one or more first signal routing structures 420 of the first microelectronic device structure that are not in contact with a corresponding signal routing structure of the second microelectronic device structure and one or more second signal routing structures 460 in electrical communication with an additional signal routing structure 464 of a second microelectronic device structure.

With continued reference to FIG. 5, the first signal routing structures 420 and the second signal routing structures 460 may be arranged such that they are located outside the lateral boundaries and the periphery of the bond pad connection structures 410. Stated another way, the first signal routing structures 420 and the second signal routing structures 460 may detour around the periphery of the bond pad connection structures 410. In some embodiments, at least some of the first signal routing structures 420 and the second signal routing structures 460 may include angled portions 470 that may facilitate routing of the first signal routing structures 420 and the second signal routing structures 460 around the periphery of the bond pad connection structures 410.

Figure 6A:
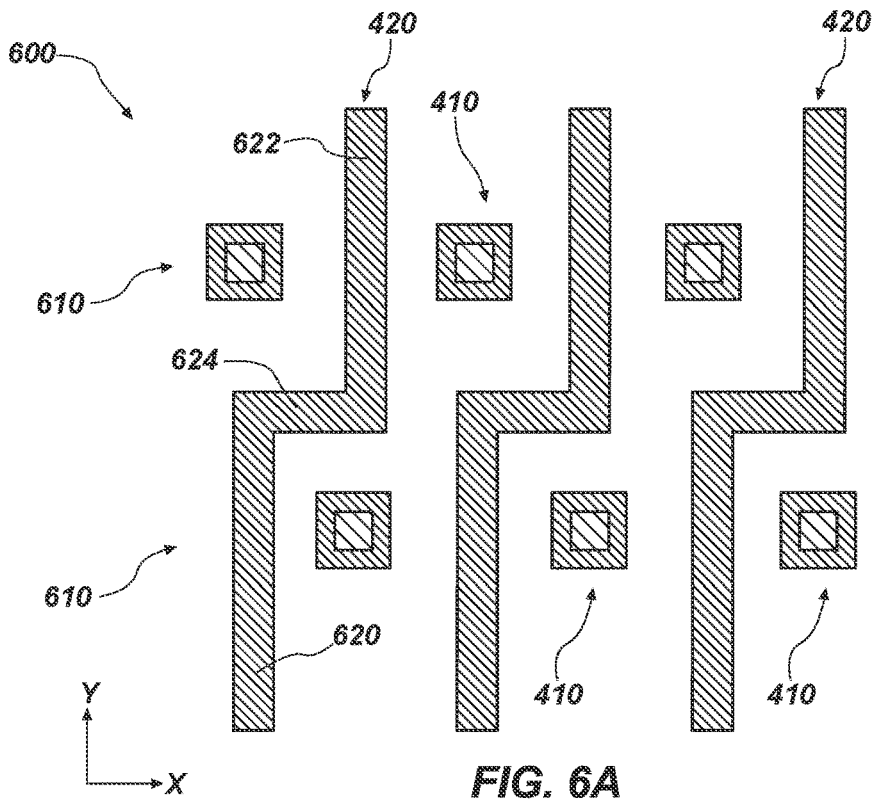
FIG. 6A and FIG. 6B are simplified top views of bond pad regions, in accordance with additional embodiments of the disclosure.

FIG. 6A is a simplified top down view of a bond pad region 600 (e.g., the bond pad regions 193, 393) including bond pad connection structures 410, in accordance with embodiments of the disclosure. The bond pad connection structures 410 may be substantially the same as the bond pad connection structures 410 described above with reference to FIG. 4A and FIG. 4B.

The bond pad region 600 may include first signal routing structures 420 that are substantially the same as the first signal routing structure 420 of FIG. 4A. Although FIG. 6A illustrates that bond pad region 600 includes only the first signal routing structures 420, the disclosure is not so limited. In some embodiments, one or more of (e.g., all of) the first signal routing structures 420 may be replaced with the second signal routing structures 460 (FIG. 4B). In addition, the bond pad region 600 may include one or more additional signal routing structures 464 (FIG. 4B).

The bond pad connection structures 410 may be arranged in rows 610. In some embodiments, the bond pad connection structures 410 of a first row 610 are laterally offset (e.g., in the X-direction) from the bond pad connection structures 410 of a neighboring (e.g., the Y-direction) row 610. In some embodiments, the bond pad connection structures 410 of a row 610 are located laterally between (e.g., in the X-direction) bond pad connection structures 410 of neighboring (e.g., in the X-direction) rows 610. In some embodiments, the bond pad connection structures 410 may be located outside the lateral boundaries of the bond pad connection structures 410 of neighboring rows 610. In some embodiments, the bond pad connection structures 410 of every other row 610 may be laterally aligned (e.g., in the X-direction).

In some embodiments, the first signal routing structures 420 may include a first laterally (e.g., in the Y-direction) extending portion 620, a second laterally (e.g., in the Y-direction) extending portion 622, and a third laterally (e.g., in the X-direction) extending portion 624 between the first laterally extending portion 620 and the second laterally extending portion 622. In some embodiments, the third laterally extending portion 624 is substantially perpendicular to the first laterally extending portion 620 and the second laterally extending portion 622. In some embodiments, the third laterally extending portions 624 extend between neighboring rows 610 of the bond pad connection structures 410. The first laterally extending portions 620 and the second laterally extending portions 622 may be laterally aligned (e.g., in the Y-direction) with the bond pad connection structures 410.

Figure 6B:
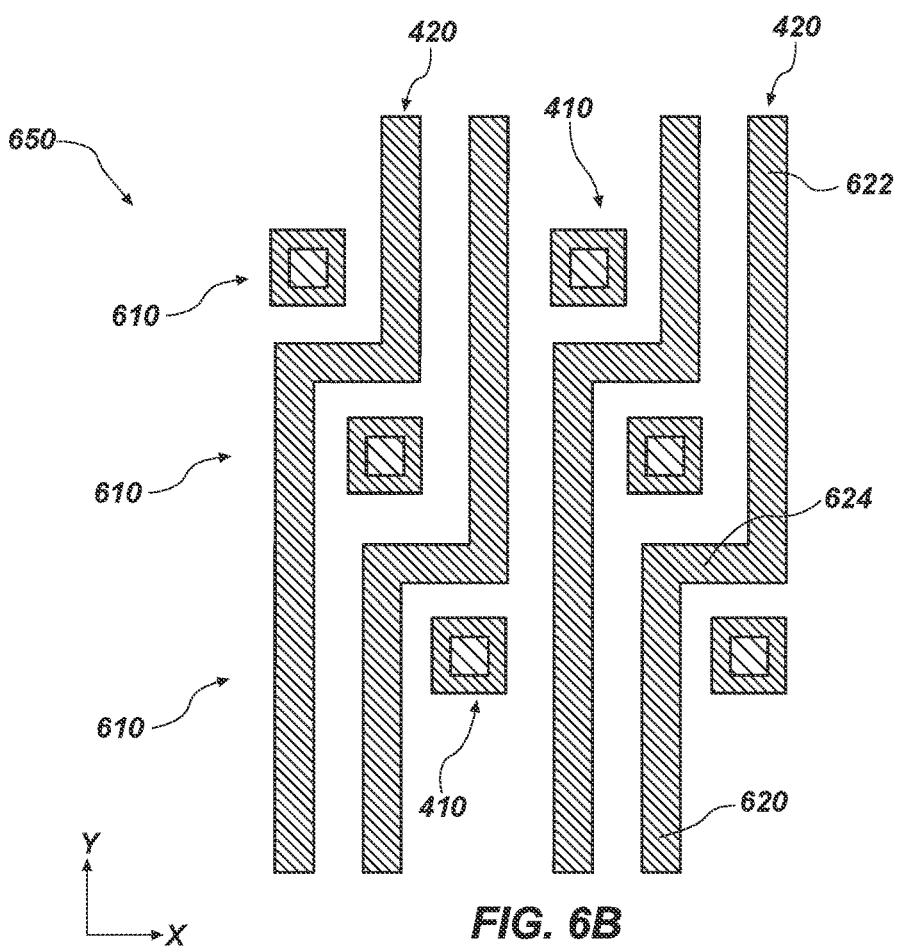

FIG. 6B is a simplified top down view of a bond pad region 650 (e.g., the bond pad region 193, 393) including bond pad connection structures 410, in accordance with embodiments of the disclosure.

The bond pad region 650 may include first signal routing structures 420 that are substantially the same as the first signal routing structure 420 of FIG. 4A. Although FIG. 6A illustrates that bond pad region 650 includes only the first signal routing structures 420, the disclosure is not so limited. In some embodiments, one or more of (e.g., all of) the first signal routing structures 420 may be replaced with the second signal routing structures 460 (FIG. 4B). In addition, the bond pad region 650 may include one or more additional signal routing structures 464 (FIG. 4B).

The bond pad connection structures 410 may be arranged in rows 610, as described above with reference to FIG. 6A. In some embodiments, the bond pad connection structures 410 of a first row 610 are laterally offset (e.g., in the X-direction) from the bond pad connection structures 410 of a neighboring (e.g., the Y-direction) row 610. In addition, in some embodiments, each bond pad connection structure 410 may be laterally aligned (e.g., in the X-direction) with bond pad connection structures 410 spaced from the first bond pad connection structure 410 by at least two (e.g., two, three, four, five, six) rows 610. For example, the bond pad connection structures 410 of every third row 610 may be laterally aligned.

Thus, in accordance with embodiments of the disclosure a microelectronic device comprises a first die and a second die attached to the first die. The first die comprises a memory array region comprising a stack structure comprising vertically alternating conductive structures and insulative structures, vertically extending strings of memory cells within the stack structure, and first bond pad structures vertically neighboring the vertically extending strings of memory cells. The second die comprises a control logic region comprising control logic devices configured to effectuate at least a portion of control operations for the vertically extending string of memory cells, second bond pad structures in electrical communication with the first bond pad structures, and signal routing structures located at an interface between the first die and the second die.

Thus, in accordance with additional embodiments of the disclosure, a microelectronic device comprises a first microelectronic device structure comprising a memory array region comprising vertically extending strings of memory cells within a stack structure comprising a vertically alternating sequence of conductive structures and insulative structures, a second microelectronic device structure comprising control logic circuitry comprising complementary metal oxide semiconductor circuitry, and a bond pad region at an interface between the first microelectronic device structure and the second microelectronic device structure. The bond pad region comprises first bond pad structures coupled to the first microelectronic device structure, second bond pad structures coupled to the second microelectronic device structure and in contact with the first bond pad structures, and signal routing structures in contact with at least the second microelectronic device structure and laterally neighboring the first bond pad structures and the second bond pad structures.

Thus in accordance with further embodiments of the disclosure, a method of forming a microelectronic device comprises forming a first microelectronic device structure comprising a memory array region comprising a stack structure comprising vertically alternating conductive structures and insulative structures, vertically extending strings of memory cells extending through the stack structure, and first bond pad structures vertically displaced from the stack structure. The method further comprises forming a second microelectronic device comprising a control logic region configured to effectuate one or more control operations for the vertically extending string of memory cells, second bond pad structures vertically displaced from the control logic region, and signal routing structures vertically displaced from the control logic region. The method further comprises attaching the first microelectronic device structure to the second microelectronic device structure by coupling the first bond pad structures to the second bond pad structures, the signal routing structures located at an interface between the first microelectronic device structure and the second microelectronic device structure.

Figure 7:
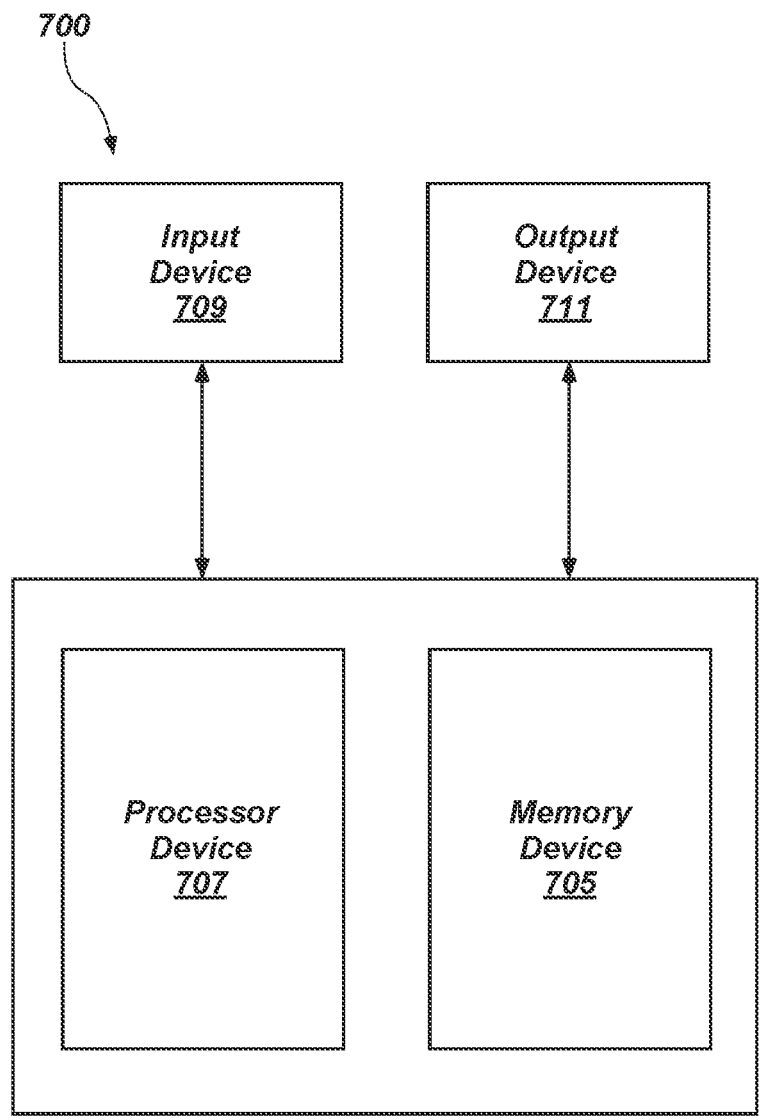
FIG. 7 is a block diagram of an electronic system, in accordance with embodiments of the disclosure.

Microelectronic devices including microelectronic devices structure assemblies (e.g., the microelectronic device structure assemblies 195, 295, 395) including the bond pad regions 193, 393 including bond pad structures (e.g., the first bond pad structures 110, the second bond pad structures 112, and the third bond pad structures 186) and signal routing structures (e.g., second signal routing structures 116, the second signal routing structures 316, the third signal routing structures 318, the additional signal routing structures 352), according to embodiments of the disclosure may be used in embodiments of electronic systems of the disclosure. For example, FIG. 7 is a block diagram of an electronic system 700, in accordance with embodiments of the disclosure. The electronic system 700 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPAD® or SURFACE® tablet, an electronic book, a navigation device, etc. The electronic system 700 includes at least one memory device 705. The memory device 705 may include, for example, an embodiment of a microelectronic device structure previously described herein or a microelectronic device structure assembly (e.g., the microelectronic device structure assembly 195, 295, 395 previously described with reference to FIG. 1A through FIG. 3B).

The electronic system 700 may further include at least one electronic signal processor device 707 (often referred to as a "microprocessor"). The electronic signal processor device 707 may, optionally, include an embodiment of a microelectronic device structure assembly (e.g., one or more of the microelectronic device structure assembly 195, 295, 395 previously described with reference to FIG. 1A through FIG. 3B). The electronic system 700 may further include one or more input devices 709 for inputting information into the electronic system 700 by a user, such as, for example, a mouse or other pointing device, a keyboard, a touchpad, a button, or a control panel. The electronic system 700 may further include one or more output devices 711 for outputting information (e.g., visual or audio output) to a user such as, for example, a monitor, a display, a printer, an audio output jack, a speaker, etc. In some embodiments, the input device 709 and the output device 711 may comprise a single touchscreen device that can be used both to input information to the electronic system 700 and to output visual information to a user. The input device 709 and the output device 711 may communicate electrically with one or more of the memory device 705 and the electronic signal processor device 707.

Figure 8:
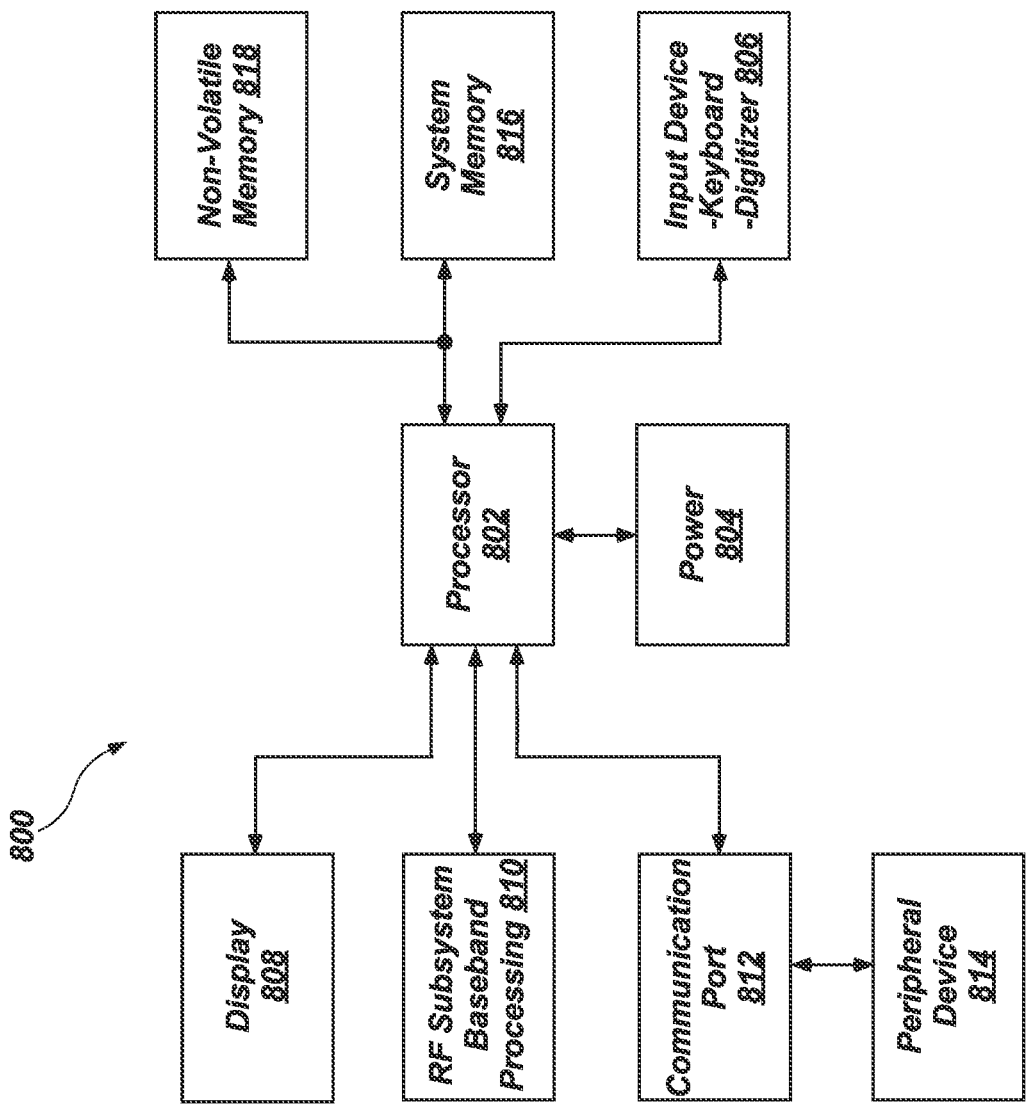
FIG. 8 is a block diagram of a processor-based system, in accordance with embodiments of the disclosure.

With reference to FIG. 8, depicted is a processor-based system 800. The processor-based system 800 may include various microelectronic devices and microelectronic device structure assemblies (e.g., microelectronic device structure assembly 195, 295, 395) manufactured in accordance with embodiments of the present disclosure. The processor-based system 800 may be any of a variety of types such as a computer, pager, cellular phone, personal organizer, control circuit, or other electronic device. The processor-based system 800 may include one or more processors 802, such as a microprocessor, to control the processing of system functions and requests in the processor-based system 800. The processor 802 and other subcomponents of the processor-based system 800 may include microelectronic device structure assemblies (e.g., microelectronic device structure assemblies 195, 295, 395) manufactured in accordance with embodiments of the present disclosure.

The processor-based system 800 may include a power supply 804 in operable communication with the processor 802. For example, if the processor-based system 800 is a portable system, the power supply 804 may include one or more of a fuel cell, a power scavenging device, permanent batteries, replaceable batteries, and rechargeable batteries. The power supply 804 may also include an AC adapter; therefore, the processor-based system 800 may be plugged into a wall outlet, for example. The power supply 804 may also include a DC adapter such that the processor-based system 800 may be plugged into a vehicle cigarette lighter or a vehicle power port, for example.

Various other devices may be coupled to the processor 802 depending on the functions that the processor-based system 800 performs. For example, input devices 806 (e.g., user interface) may be coupled to the processor 802. The input devices 806 may include devices such as buttons, switches, a keyboard, a light pen, a mouse, a digitizer and stylus, a touch screen, a voice recognition system, a microphone, or a combination thereof. A display 808 may also be coupled to the processor 802. The display 808 may include an LCD display, an SED display, a CRT display, a DLP display, a plasma display, an OLED display, an LED display, a three-dimensional projection, an audio display, or a combination thereof. Furthermore, an RF sub-system/baseband processor 810 may also be coupled to the processor 802. The RF sub-system/baseband processor 810 may include an antenna that is coupled to an RF receiver and to an RF transmitter (not shown). A communication port 812, or more than one communication port 812, may also be coupled to the processor 802. The communication port 812 may be adapted to be coupled to one or more peripheral devices 814, such as a modem, a printer, a computer, a scanner, or a camera, or to a network, such as a local area network, remote area network, intranet, or the Internet, for example.

The processor 802 may control the processor-based system 800 by implementing software programs stored in the memory. The software programs may include an operating system, database software, drafting software, word processing software, media editing software, or media playing software, for example. The memory is operably coupled to the processor 802 to store and facilitate execution of various programs. For example, the processor 802 may be coupled to system memory 816, which may include one or more of spin torque transfer magnetic random access memory (STT-MRAM), magnetic random access memory (MRAM), dynamic random access memory (DRAM), static random access memory (SRAM), racetrack memory, and other known memory types. The system memory 816 may include volatile memory, non-volatile memory, or a combination thereof. The system memory 816 is typically large so that it can store dynamically loaded applications and data. In some embodiments, the system memory 816 may include semiconductor devices, such as the microelectronic device structure assemblies (e.g., the microelectronic device structure assemblies 195, 295, 395) described above, or a combination thereof.

The processor 802 may also be coupled to non-volatile memory 818, which is not to suggest that system memory 816 is necessarily volatile. The non-volatile memory 818 may include one or more of STT-MRAM, MRAM, read-only memory (ROM) such as an EPROM, resistive read-only memory (RROM), and flash memory to be used in conjunction with the system memory 816. The size of the non-volatile memory 818 is typically selected to be just large enough to store any necessary operating system, application programs, and fixed data. Additionally, the non-volatile memory 818 may include a high-capacity memory such as disk drive memory, such as a hybrid-drive including resistive memory or other types of non-volatile solid-state memory, for example. The non-volatile memory 818 may include microelectronic devices including microelectronic device structures, such as the microelectronic device structures (e.g., the first microelectronic device structure 100, 300, the second microelectronic device structure 150, 250, 350), and microelectronic device structure assemblies (e.g., the microelectronic device structure assemblies 195, 295, 395) described above, or a combination thereof.

Thus, in accordance with embodiments of the disclosure an electronic system comprises an input device, an output device, a processor device operably coupled to the input device and the output device, and a memory device operably coupled to the processor device. The memory device comprises a first microelectronic device structure comprising a stack structure comprising tiers each comprising a conductive structure and an insulative structure vertically neighboring the conductive structure, vertically extending strings of memory cells within the stack structure, and first bond pad structures vertically displaced from the stack structure. The memory device further comprises a second microelectronic device structure comprising a control logic region comprising CMOS circuitry, second bond pad structures coupled to the first bond pad structures, and signal routing structures between the first microelectronic device structure and the second microelectronic device structure.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A microelectronic device, comprising:
    a first die comprising:
        a memory array region;
        first bond pad structures vertically neighboring the memory array region; and
        first signal routing structures neighboring the first bond pad structures in a first horizontal direction and substantially linearly extending in parallel a second horizontal direction orthogonal to the first horizontal direction; and
    a second die attached to the first die, the second die comprising:
        a control logic region comprising control logic devices;
        second bond pad structures at an interface between the first die and the second die and in contact with the first bond pad structures; and
        second signal routing structures at the interface, in physical contact with the first signal routing structures, and substantially linearly extending in parallel in the second horizontal direction.

2. The microelectronic device of claim 1, wherein a horizontal dimension of the second signal routing structures in the first horizontal direction is greater than a horizontal dimension of the first signal routing structures in the first horizontal direction.

3. The microelectronic device of claim 1, further comprising third signal routing structures within the second die and horizontally spaced from the second signal routing structures and the second bond pads, at least one of the third signal routing structures horizontally extending in a non-linear path relative to the second signal routing structures.

4. The microelectronic device of claim 3, the third signal routing structures are in contact with a dielectric material of the first die.

5. The microelectronic device of claim 1, wherein the first bond pad structures are located within horizontal boundaries of the second bond pad structures.

6. The microelectronic device of claim 1, wherein the first signal routing structures are located within horizontal boundaries of the second signal routing structures.

7. A microelectronic device, comprising:
    a first microelectronic device structure comprising:
        a memory array region comprising memory cells; and
        first bond pad structures vertically displaced from the memory cells; and
    a second microelectronic device structure comprising:
        a control logic region comprising complementary metal-oxide-semiconductor (CMOS) circuitry;
        second bond pad structures coupled to the first bond pad structures at an interface of the first microelectronic device structure and the second microelectronic device structure; and
        signal routing structures at the interface, one of the signal routing structures substantially horizontally circumscribing one of the first bond pad structures and one of the second bond pad structures coupled to the one of the first bond pad structures.

8. The microelectronic device of claim 7, wherein the second bond pad structures are located within horizontal boundaries of the first bond pad structures.

9. The microelectronic device of claim 7, further comprising a dielectric material substantially horizontally circumscribing the one of the first bond pad structures and the one of the second bond pad structures, the dielectric material horizontally interposed between the one of the signal routing structures and the one of the first bond pad structures and the one of the second bond pad structures.

10. The microelectronic device of claim 7, further comprising additional signal routing structures within the first microelectronic device structure and located at the interface, one of the additional signal routing structures in physical contact with the one of the signal routing structures.

11. The microelectronic device of claim 10, wherein horizontal dimensions of the one of the additional signal routing structures are smaller than horizontal dimensions of the one of the signal routing structures.

12. A microelectronic device, comprising:
a first die comprising:
a memory array region; and
first bond pad structures vertically neighboring the memory array region; and
a second die attached to the first die, the second die comprising:
a control logic region comprising control logic devices;
second bond pad structures at an interface between the first die and the second die and in physical contact with the first bond pad structures; and
signal routing structures at the interface between the first die and the second die, one of the first bond pad structures and one of the second bond pad structures horizontally interposed in a first direction between two of the signal routing structures horizontally extending in non-linear paths, the two of the signal routing structures respectively comprising:
first portions horizontally overlapping the one of the first bond pad structures and the one of the second bond pad structures in the first direction;
a second portion completely horizontally offset from the one of the first bond pad structures and the one of the second bond pad structures in the first direction; and
third portions diagonally horizontally extending from and between the second portion and the first portions.

13. The microelectronic device of claim 12, further comprising additional signal routing structures within the first die and having vertical boundaries at the interface between the first die and the second die, one of the additional signal routing structures in physical contact with one of the signal routing structures.

14. The microelectronic device of claim 13, wherein the additional signal routing structures comprise substantially the same material composition as the signal routing structures.

15. The microelectronic device of claim 12, wherein the signal routing structures are electrically isolated from the first die.

16. A microelectronic device, comprising:
a first die comprising:
a memory array region; and
first bond pad structures vertically neighboring the memory array region; and
a second die attached to the first die, the second die comprising:
a control logic region comprising control logic devices;
second bond pad structures at an interface between the first die and the second die and in physical contact with the first bond pad structures; and
signal routing structures at the interface between the first die and the second die, one of the first bond pad structures and one of the second bond pad structures horizontally interposed in a first direction between two of the signal routing structures horizontally extending in non-linear paths, one of the two of the signal routing structures comprising:
a first portion horizontally overlapping the one of the first bond pad structures and the one of the second bond pad structures in the first direction;
a second portion completely horizontally offset from the one of the first bond pad structures and the one of the second bond pad structures in the first direction; and
a third portion horizontally extending from and between the first portion and the second portion in a second direction orthogonal to the first direction.

* * * * *

UNITED STATES PATENT AND TRADEMARK OFFICE
CERTIFICATE OF CORRECTION

PATENT NO. : 12,068,272 B2
APPLICATION NO. : 18/059165
DATED : August 20, 2024
INVENTOR(S) : Akira Goda, Kunal R. Parekh and Aaron S. Yip It is certified that error appears in the above-identified patent and that said Letters Patent is hereby corrected as shown below:

In the Specification

| | | |
|---|---|---|
| Column 1, | Line 10, | change "2020, issued as U.S." to --2020, now U.S.-- |
| Column 5, | Line 10, | change "oxide ($MgO_x$), at" to --oxide ($MgO_x$)), at-- |

Signed and Sealed this
Fifteenth Day of October, 2024

Katherine Kelly Vidal
*Director of the United States Patent and Trademark Office*